(12) United States Patent
Zhu et al.

(10) Patent No.: US 12,477,803 B2
(45) Date of Patent: Nov. 18, 2025

(54) TRANSISTOR WITH DEFECT MITIGATION STRUCTURES

(71) Applicant: NXP USA, Inc., Austin, TX (US)

(72) Inventors: Congyong Zhu, Gilbert, AZ (US); Darrell Glenn Hill, Chandler, AZ (US); David Robert Currier, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 414 days.

(21) Appl. No.: 18/166,133

(22) Filed: Feb. 8, 2023

(65) Prior Publication Data

US 2024/0266406 A1    Aug. 8, 2024

(51) Int. Cl.
| | |
|---|---|
| H10D 30/01 | (2025.01) |
| H01L 23/31 | (2006.01) |
| H10D 30/47 | (2025.01) |
| H10D 62/85 | (2025.01) |
| H10D 64/00 | (2025.01) |
| H10D 64/01 | (2025.01) |
| H10D 64/27 | (2025.01) |
| H01L 23/48 | (2006.01) |

(52) U.S. Cl.
CPC ....... *H10D 64/118* (2025.01); *H01L 23/3171* (2013.01); *H01L 23/3192* (2013.01); *H10D 30/015* (2025.01); *H10D 30/475* (2025.01); *H10D 62/8503* (2025.01); *H10D 64/01* (2025.01); *H10D 64/111* (2025.01); *H10D 64/411* (2025.01); *H01L 23/481* (2013.01)

(58) Field of Classification Search
CPC ............ H01L 23/3171; H01L 23/3192; H10D 30/015; H10D 64/01–037
See application file for complete search history.

(56) References Cited

U.S. PATENT DOCUMENTS

| | | | |
|---|---|---|---|
| 9,324,853 B2 | 4/2016 | Basu et al. | |
| 2019/0148378 A1 | 5/2019 | Dewey et al. | |
| 2024/0145559 A1* | 5/2024 | Hsieh | H01L 21/02164 |

* cited by examiner

*Primary Examiner* — Daniel P Shook
(74) *Attorney, Agent, or Firm* — Andrew C. Milhollin

(57) ABSTRACT

A transistor device includes a semiconductor substrate and a gate structure formed over the substrate. When fabricating the transistor device, at least one dielectric layer may be formed over ohmic contact structures of the transistor device, which may mitigate migration of material, such as metal, from the ohmic contact structures onto sensitive surfaces of the transistor device during subsequent fabrication processes. The transistor device may include one or more dielectric spacers, including at least one dielectric spacer disposed at a side wall of a gate channel through which gate structure contacts the substrate. The transistor device may include a field plate formed at least partially over the gate structure, the field plate having one or more stepped portions, which may improve linearity performance of the transistor device.

11 Claims, 22 Drawing Sheets

TRANSISTOR WITH DEFECT MITIGATION STRUCTURES

TECHNICAL FIELD

Embodiments of the subject matter described herein relate generally to transistor devices, and more particularly to semiconductor power transistors with defect mitigation structures.

BACKGROUND

High-power field effect transistor (FET) devices find application in a wide variety of electronic components and systems. While various advances have been made to improve gain, efficiency, and other characteristics of power FETs that are used to provide amplification in radio frequency (RF) communication systems, challenges still exist for fabricating such devices. For example, fabricating FETs with short gate lengths using photolithography alone is more challenging for gallium nitride (GaN) on silicon carbide (SiC) based FETs than for silicon (Si) based FETs, due in part to transparency of SiC substrates and to lack of sufficiently uniform flatness of GaN-on-SiC substrates due to, for example, side effects of heteroepitaxy (used to grow GaN on SiC). As another example, during fabrication, defects in ohmic contact structures in such transistor devices may migrate to other regions of the transistor device, such as the gate channel, which may undesirably impact performance and reliability of the transistor device.

SUMMARY

A brief summary of various exemplary embodiments is presented below. Some simplifications and omissions may be made in the following summary, which is intended to highlight and introduce some aspects of the various exemplary embodiments, without limiting the scope. Detailed descriptions of an exemplary embodiment adequate to allow those of ordinary skill in the art to make and use these concepts will follow in later sections.

In an example embodiment, a transistor device may include a semiconductor substrate, a first dielectric layer disposed on a surface of the semiconductor substrate, at least one ohmic contact structure disposed on the surface of the semiconductor substrate, a second dielectric layer disposed directly on each of the first dielectric layer and the at least one ohmic contact structure, a gate structure disposed in respective openings in the first dielectric layer and the second dielectric layer and disposed directly on the surface of the semiconductor substrate, an interlayer dielectric layer disposed over the first dielectric layer, the second dielectric layer, and the gate structure, and a third dielectric layer having a first portion disposed between the gate structure and the semiconductor substrate and between the gate structure and the first dielectric layer and having a second portion disposed between the interlayer dielectric layer and the second dielectric layer. Portions of the first dielectric layer may be interposed directly between portions of the gate structure and the surface of the semiconductor substrate.

In one or more embodiments, the transistor device includes a first dielectric spacer structure disposed directly between the third dielectric layer and the gate structure.

In one or more embodiments, the first portion of the third dielectric layer is disposed between the first dielectric spacer structure and the first dielectric layer.

In one or more embodiments, the first portion of the third dielectric layer is disposed between the first dielectric spacer structure and each of the first dielectric layer and the second dielectric layer.

In one or more embodiments, the transistor device includes a second dielectric spacer structure disposed directly between the second portion of the third dielectric layer and the interlayer dielectric layer.

In one or more embodiments, a first surface of the first dielectric layer is in direct contact with the gate structure and a second surface of the first dielectric layer is in direct contact with the surface of the semiconductor substrate.

In one or more embodiments, at least a portion of the second dielectric layer is interposed directly between the gate structure and the first dielectric layer.

In one or more embodiments, the third dielectric layer has a thickness of less than 100 angstroms.

In one or more embodiments, the transistor device includes a field plate disposed on the interlayer dielectric layer and overlapping the gate structure, the field plate being electrically coupled to a first ohmic contact structure of the at least one ohmic contact structure.

In one or more embodiments, a method of fabricating a transistor device includes steps of providing a semiconductor substrate, forming a first dielectric layer on the semiconductor substrate, forming ohmic contact structures on the semiconductor substrate, forming a second dielectric layer on the first dielectric layer and the ohmic contact structures, the second dielectric layer directly on the ohmic contact structures, forming a gate channel by etching a first opening in the first dielectric layer and a second opening in the second dielectric layer, a surface of the semiconductor substrate being exposed through the first opening, forming a third dielectric layer on the second dielectric layer and in the gate channel, forming at least one photoresist layer over the semiconductor substrate, forming at least one opening in the at least one photoresist layer by selectively removing portions of the at least one photoresist layer to expose portions of the third dielectric layer that are disposed in the gate channel, selectively etching the exposed portions of the third dielectric layer to expose at least the surface of the semiconductor substrate, and forming a gate structure in at least the gate channel and in contact with the surface of the semiconductor substrate.

In one or more embodiments, the method further includes steps of forming an interlayer dielectric layer over the gate structure and the third dielectric layer, and forming a field plate over the interlayer dielectric layer, with at least a portion of the field plate overlapping the gate structure.

In one or more embodiments, the ohmic contact structures include a first ohmic contact structure and a second ohmic contact structure, the gate structure is disposed between the first ohmic contact structure and the second ohmic contact structure, the second dielectric layer is formed covering surfaces of each of the first ohmic contact structure and the second ohmic contact structure, and the field plate is electrically coupled to the first ohmic contact structure.

In one or more embodiments, the at least one photoresist layer includes a first photoresist layer and a second photoresist layer, forming the at least one opening may include steps of forming a third opening in the first photoresist layer, and forming a fourth opening in the second photoresist layer. The fourth opening may be larger than the third opening such that a portion of the first photoresist layer overhangs the second photoresist layer at the third opening and the fourth opening.

In one or more embodiments, forming the gate structure may include depositing metal over the semiconductor substrate, a first portion of the metal being deposited through the third opening and the fourth opening to form the gate structure, and a second portion of the metal being deposited on surfaces of the first photoresist layer.

In one or more embodiments, the method may further include a step of removing the second portion of the metal via concurrent removal of the first photoresist layer and the second photoresist layer.

In one or more embodiments, the method may further include steps of depositing a dielectric spacer layer on the third dielectric layer, and etching the dielectric spacer layer to form at least one spacer structure including a first spacer structure disposed in the gate channel.

In one or more embodiments, the at least one spacer structure further includes a second spacer structure disposed in the gate channel, a third spacer structure disposed over at least the first dielectric layer and the second dielectric layer, and a fourth spacer structure disposed over at least the first dielectric layer and the second dielectric layer.

In one or more embodiments, forming the gate channel further includes forming a photoresist layer over the second dielectric layer, forming a third opening in the photoresist layer, and etching additional portions of the second dielectric layer, undercutting the photoresist layer.

In one or more embodiments, forming the third dielectric layer further includes forming the third dielectric layer on surfaces of the second dielectric layer, side walls of the first dielectric layer, and the surface of the semiconductor substrate in the gate channel, the side walls of the first dielectric layer defining at least a portion of the gate channel.

In one or more embodiments, forming the third dielectric layer includes forming the third dielectric layer on side walls of the second dielectric layer, the side walls of the second dielectric layer defining at least an additional portion of the gate channel.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
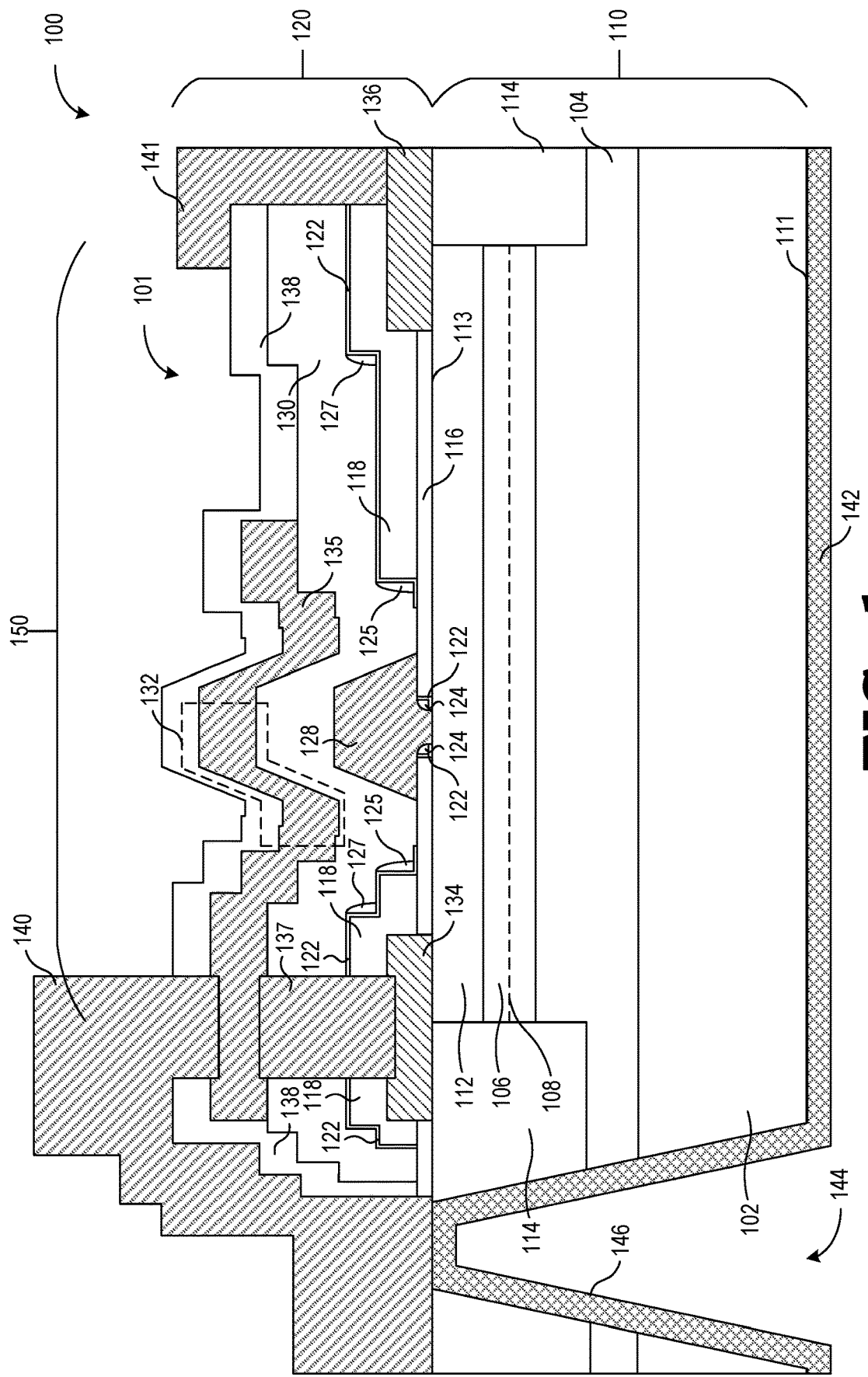
FIG. 1 is a cross-sectional side view of a transistor device, in accordance with various embodiments.

The following detailed description is merely illustrative in nature and is not intended to limit the embodiments of the subject matter or the application and uses of such embodiments. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. As used herein, the words "exemplary" and "example" mean "serving as an example, instance, or illustration." Any implementation described herein as exemplary or an example is not necessarily to be construed as preferred or advantageous over other implementations.

Directional references such as "top," "bottom," "left," "right," "above," "below," and so forth, unless otherwise stated, are not intended to require any preferred orientation and are made with reference to the orientation of the corresponding figure or figures for purposes of illustration.

For the sake of brevity, conventional semiconductor fabrication techniques may not be described in detail herein. In addition, certain terms may also be used herein for reference only, and thus are not intended to be limiting. For instance, the terms "first", "second", and other such numerical terms referring to structures do not imply a sequence or order unless clearly indicated by the context.

Various embodiments described herein relate to transistor devices and an associated fabrication methods in which a protective dielectric layer is formed over ohmic contact structures of a given transistor device prior to gate structure formation. The protective dielectric layer may cover the ohmic contact structures, thereby mitigating defects that could otherwise be caused by migration of material (e.g., metal) from the ohmic contact structures to other regions of the transistor device, such as the gate channel region (e.g., potentially causing defects in the surface of the substrate exposed when forming the gate channel).

In one or more embodiments, portions of the protective dielectric layer are removed (e.g., via undercutting or a separate etch process, according to various embodiments) after forming the gate opening to reduce the thickness of dielectric material present between the gate structure and the substrate to a suitable thickness. In one or more other embodiments, such portions of the protective dielectric layer are not removed and a suitable thickness of the dielectric material present between the gate structure and the substrate is instead achieved by using thinner dielectric layers between the gate structure and the substrate.

In one or more embodiments, dielectric spacer structures may be formed in the gate opening and at one or more side walls of the protective dielectric layer. For example, a pair of dielectric spacer structures may be formed at interior sidewalls of the gate opening to reduce the gate length of a gate of the transistor device. Such an approach may allow shorter gate lengths to be achieved than would otherwise be achievable using photolithography alone (due, at least in part, to reduction in gate length by the dielectric spacer structures). For example, by adjusting the thickness (by changing the amount of deposited material) of a dielectric spacer layer from which such spacer structures are formed, the width of each spacer structure may be correspondingly adjusted, thereby providing greater flexibility in determining the gate length of the gate structure (that is, the length of the portion of the gate structure that spans the gate channel) of the transistor device.

A thin (e.g., less than around 100 angstroms) dielectric layer may be formed over the protective dielectric layer, a portion of which may be removed prior to gate structure formation (e.g., gate metal deposition). Removal of this portion of the thin dielectric layer may result in subsequently formed layers, including a field plate of the transistor device to include at least one additional stepped region. For example, the additional stepped region in the field plate may improve linearity performance for one or more embodiments of the transistor device (e.g., including one or more embodiments in which the transistor device is a GaN transistor device). For example, because the field plate includes one or more stepped portions, linearity performance of the transistor device may be advantageously improved due to corresponding modification of the gate-drain capacitance (Cgd) vs. drain-source voltage (Vds) curve attributable to the different depletion depths from the field plate to the channel electrons. The thin dielectric layer may also act as a "stop etch" structure when etching dielectric material to form the dielectric spacer structures, which may mitigate damage to surfaces of the substrate that may otherwise be exposed and susceptible to being damaged by the etch process.

FIG. 1 is a cross sectional side view of a transistor device 100 in accordance with one or more embodiments. The transistor device 100 may be formed on a semiconductor die having a base semiconductor substrate 110 (sometimes referred to herein as the "substrate 110") and an overlying build-up structure 120. The substrate 110 is defined by an upper surface 113 and a lower surface 111, along with side walls that extend between the lower and upper substrate surfaces 111, 113. Multiple additional electrical structures, patterned conductive layers, and dielectric layers are included in the build-up structure 120, which is connected to and overlies the upper surface 113 of the substrate 110.

In one or more embodiments, an active region 150 is defined corresponding to a portion of the substrate 110 and an overlying portion of the build-up structure 120. One or more isolation regions 114 may be included within the substrate 110 at the upper surface 113. The active region 150 may include portions of the substrate 110 extending between at least two of the isolation regions 114.

In one or more embodiments, the semiconductor substrate 110 may include a host semiconductor substrate 102 (sometimes referred to herein as the "host substrate 102") and multiple layers overlying the host substrate 102. In one or more embodiments, the layers overlying the host substrate 102 may include a buffer layer 104, a channel layer 106, and a barrier layer 112, all of which are described in more detail, below.

In one or more embodiments, the build-up structure 120 is formed on and over the upper surface 113 of the substrate 110 and includes various electrical structures (e.g., gate electrode 128, ohmic contact structures 134, 136), multiple dielectric layers (e.g., dielectric layers 116, 118, 122, 130, 138) and dielectric structures (e.g., spacer structures 124, 125, 127), and multiple patterned conductive layers (e.g., a field plate 135, interconnects 137, 140, 141).

In some embodiments, a backside metal layer 142 is formed on the lower surface 111 of the substrate 110. The backside metal layer 142 may be electrically connected to conductive material 146 formed in a through substrate via (TSV) 144, which electrically connects the backside metal layer 142 to the interconnect layer 140 at the upper surface 113 of the substrate 110.

A transistor 101 is formed in the active region 150 of the transistor device 100. In various embodiments, the transistor 101 is a field effect transistor (FET), which includes a gate electrode 128 (sometimes referred to herein as the "control electrode 128" or "gate structure 128"), a first ohmic contact structure 134 (sometimes referred to as the "source electrode 134" or "current-carrying electrode" 134) proximate to but spaced apart from a first sidewall of the gate electrode 128, and a second ohmic contact structure 136 (sometimes referred to as the "drain electrode 136" or "current-carrying electrode 136") proximate to but spaced apart from a second sidewall of the gate electrode 128, each of which are disposed at the upper surface 113 of the substrate 110 and are formed in the build-up structure 120 overlying the substrate 110. In one or more embodiments, the transistor 101 is a high electron mobility transistor (HEMT). In one or more embodiments, the transistor 101 is a gallium nitride (GaN) HEMT. It should be understood that these are non-limiting examples, and that the transistor 101 may be another suitable type of transistor in accordance with one or more other embodiments.

The ohmic contact structures 134, 136 are formed at and over the upper surface 113 of the substrate 110. In one or more embodiments, respective interfaces between the ohmic contact structures 134, 136 and respective portions the substrate 110 correspond to non-rectifying low resistance junctions (i.e., "ohmic contacts") through which electrical current may be readily conducted between semiconductor material of the substrate 110 and conductive material of the ohmic contact structures 134, 136. For example, the ohmic contact structures 134, 136 may be formed substantially in-plane with respect to one another, and both of the source electrode 134 and the drain electrode 136 may extend through dielectric layers 116, 118 (sometimes referred to herein as the "first dielectric layer 116" and the "second dielectric layer 118", respectively) to directly contact the upper surface 113 of the substrate 110. Additionally, the ohmic contact structures 134, 136 may be respectively electromagnetically coupled to opposite ends of a channel 108 that is disposed within the channel layer 106 of the substrate 110. The first ohmic contact structure 134 may be electrically coupled to the TSV 144 and the backside metal layer 142 through patterned portions of one or more of the interconnect metal layers (e.g., interconnect layer 137, interconnect layer 140) of the build-up structure 120. The second ohmic contact structure 136 may be electrically coupled to an output (not shown) of the transistor device 100 via the interconnect layer 141, for example.

The gate electrode 128 may be a metallic structure that is electromagnetically coupled to the channel 108 in one or more embodiments. In one or more other embodiments, the gate electrode 128 may include non-metallic material, such as polysilicon as a non-limiting example. According to an embodiment, the gate electrode 128 extends through at least the first dielectric layer 116, the second dielectric layer 118, and a third dielectric layer 122 and between spacer structures 124 to contact the upper surface 113 of the substrate 110 between the ohmic contact structures 134, 136. An opening defined by the spacer structures 124 and the third dielectric layer 122 through which portions the gate electrode 128 are formed is sometimes referred to as the "gate channel" herein. The region of the build-up structure 120 at which the gate electrode 128 is formed is sometimes referred to as the "gate channel region" herein. In some embodiments, the interface at which the gate electrode 128 makes contact with the substrate 110 is a Schottky contact.

In one or more embodiments, the build-up structure 120 includes the dielectric layers 116, 118, 122 disposed over the upper surface 113 of the substrate 110, pairs of dielectric spacer structures 124, 125, 127 disposed at respective side walls of the third dielectric layer 122 and in proximity to sidewalls of the dielectric layer 116 and/or the dielectric layer 118, an interlayer dielectric (ILD) layer 130 formed on portions of the gate electrode 128, the spacer structures 125, 127, and the dielectric layers 116, 122, a field plate 135 formed on portions of the ILD layer 130 (overlapping portions of the gate electrode 128), and a dielectric layer 138 formed over portions of the field plate 135 and the ILD layer 130. Herein, a "side wall" of a given layer or structure refers to a surface that can be substantially non-parallel (e.g., within around 45 degrees of being orthogonal or normal to the surface 113 of the substrate 110. As mentioned above, the gate electrode 128 may extend through openings in the dielectric layers 116, 118, 122 and between the spacer structures 124. Each of the gate electrode 128 and the ohmic contact structures 134, 136 contact the upper surface 113 of the substrate 110 at various points above the channel 108. In one or more embodiments, the first dielectric layer 116 may have a thickness in a range of around 300 angstroms to around 1,500 angstroms, the second dielectric layer 118 may have a thickness in a range of around 100 to around 4,000 angstroms, and the third dielectric layer 122 may have a thickness of less than 100 angstroms (e.g., between around 10 angstroms and around 100 angstroms), although other suitable thickness values may be used.

In one or more embodiments, the dielectric layers 116, 118, 122 are formed from respective dielectric materials, such as aluminum oxide ($Al_2O_3$), silicon nitride (SiN; sometimes given as $Si_3N_4$), silicon oxide ($SiO_2$), silicon oxynitride (SiON), aluminum nitride (AlN), silicon aluminum nitride (SiAlN), hafnium oxide ($HfO_2$), zirconium oxide ($ZrO_2$), titanium oxide ($TiO_2$), or other suitable dielectric materials. In one or more embodiments, the first dielectric layer 116 may be separately etchable with respect to the second dielectric layer 118 with respect to one or more etch processes (e.g., wet chemical etch processes, such as a buffered oxide etch (BOE) or a phosphoric acid etch, or dry etch processes, such as a reactive ion etch (RIE)). In one or more embodiments, the third dielectric layer 122 may be separately etchable with respect to the spacer structures 124, 125, 127, with respect to one or more etch processes. For example, the first dielectric layer 116 and the spacer structures 124, 125, 127 may be formed from the same first dielectric material (e.g., nitride material) and the second dielectric layer 118 may be formed from a second dielectric material (e.g., oxide material) that is separately etchable with respect to the first dielectric material. In one or more embodiments, the third dielectric layer 122 may include oxide. For example, the first dielectric layer 116 may be formed from nitride (e.g., SiN, AlN, SiAlN as non-limiting examples), the second dielectric layer 118 may be formed from oxide (e.g., $SiO_2$, $ZrO_2$, $HfO_2$, $Al_2O_3$, or $TiO_2$ as non-limiting examples), the third dielectric layer 122 may be formed from oxide (e.g., $SiO_2$, $ZrO_2$, $HfO_2$, $Al_2O_3$, or $TiO_2$ as non-limiting examples), and the spacer structures 124, 125, 127 may be formed from nitride (e.g., SiN, AlN, SiAlN as non-limiting examples). Herein, two given materials are considered to be "separately etchable" with respect to a given etch process if the etch rate of a first material of the two materials is significantly greater (e.g., around 1.5 times as great or greater) than the etch rate of the second material of the two materials with respect to the given etch process. In one or more embodiments, the first dielectric layer 116 may be formed from the same material (e.g., $SiN_x$) as the spacer structures 124, 125, 127. In or more other embodiments, the first dielectric layer 116 may be formed from a different material from that of the spacer structures 124, 125, 127.

In one or more embodiments, the dielectric layers 116, 118, 122 and the dielectric layer from which the spacer structures 124, 125, 127 are formed may be respectively deposited on the substrate 110 using respective chemical vapor deposition processes, such as low-pressure chemical vapor deposition (LPCVD) or plasma enhanced chemical vapor deposition (PECVD). For example, in one or more embodiments, the second dielectric layer 118 may be formed via deposition of $SiO_2$ using a PECVD process. In one or more embodiments, the third dielectric layer 122 may be formed via deposition of aluminum oxide (e.g., $AlO_x$) using an atomic layer deposition (ALD) process. In one or more embodiments, the spacer structures 124, 125, 127 are formed via deposition of dielectric material (e.g., nitride), and subsequent \anisotropic etching of the deposited dielectric material such that only the spacer structures 124, 125, 127 remain of the originally deposited dielectric material.

The spacer structures 124 may be disposed in the gate channel in which a portion of the gate electrode 128 is formed. For example, the spacer structures 124 may be disposed on portions of the third dielectric layer 122 that are disposed in the gate channel. Side walls of the first dielectric layer 116 may define side walls of the gate channel. As will be described, the spacer structures 124 may reduce the gate length of the gate electrode 128 (e.g., to a gate length that is smaller than that achievable by conventional photolithographic equipment and techniques). Additionally, by controlling the size of the spacer structures 124, the gate length of the gate electrode 128 may be selectively adjusted.

The spacer structures 125, 127 may be formed at respective side walls of the third dielectric layer 122. The size of the spacer structures 125, 127 may affect dimensions of the field plate 135. For example, the width of the spacer structures 125, 127 may determine the locations of corresponding steps in the field plate 135, at least for those spacer structures 125, 127 that are overlapped by the field plate 135.

The field plate 135 may be formed from portions of a first conductive layer that overlaps the gate electrode 128, portions of the dielectric layers 116, 118, 122, and portions of the ILD layer 130. The interconnect layer 137 may also be formed from the first conductive layer. At various points above the channel 108 (along a dimension extending directly into the page, from the perspective of the present example), straps of conductive material are formed in a region 132 to electrically connect the field plate 135 to the interconnect layer 137. At other points above the channel 108, dielectric material from the dielectric layer 138 may instead be formed in the region 132. The straps of conductive material formed in the region 132 (in conjunction with the interconnect layer 137 and the interconnect layer 140) electrically couple the field plate 135 to the source electrode 134 and the conductive material 146 of the TSV 144 (e.g., coupling the field plate 135 to a ground or reference potential for instances in which the backside metal 142 is coupled to or otherwise configured to provide an electrical ground or reference potential).

The field plate 135 may be formed from one or more electrically conductive materials, such as titanium tungsten (TiW), titanium tungsten nitride (TiWN), tungsten silicide (WSi), as non-limiting examples. In one or more embodiments, as shown in the present example, at least some portions of the field plate 135 overlie the gate electrode 128, and thus are proximate to the sidewalls and the upper surface of the gate electrode 128, with portions of the ILD layer 130 being present between the field plate 135 and the gate electrode 128.

Figure 2:
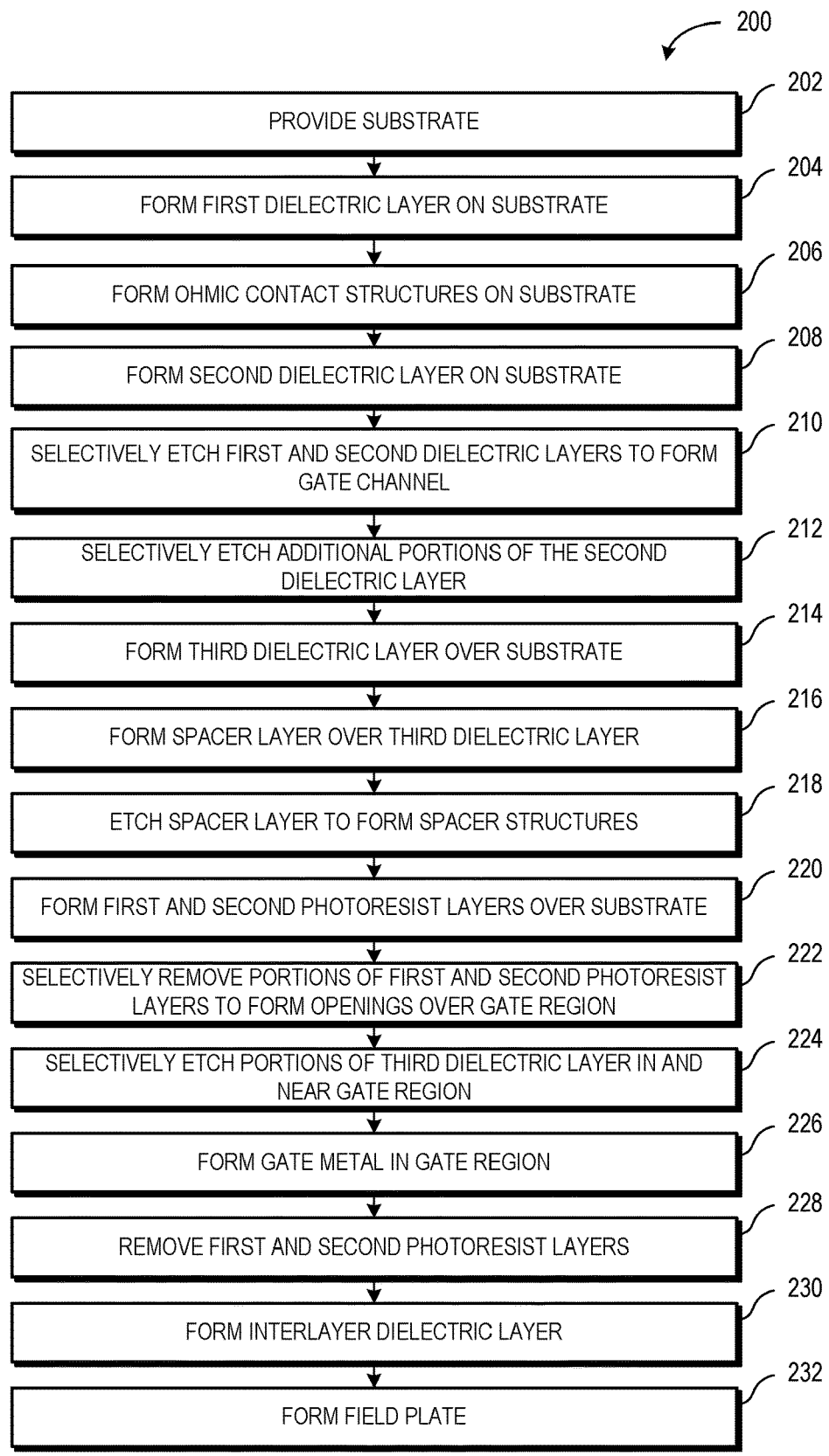
FIG. 2 is a process flow diagrams describing a method for fabricating the transistor device of FIG. 1, in accordance with various embodiments.

FIG. 2 is a process flow diagram depicting a method for fabricating at least a portion of a transistor device, such as the transistor device 100-1 of FIG. 1A, in accordance with various embodiments. For enhanced understanding, FIG. 2 may be viewed simultaneously with FIGS. 3-21, which are cross sectional views depicting the transistor device 100 of FIG. 1 at various stages of fabrication in accordance with various embodiments.

Figure 3:
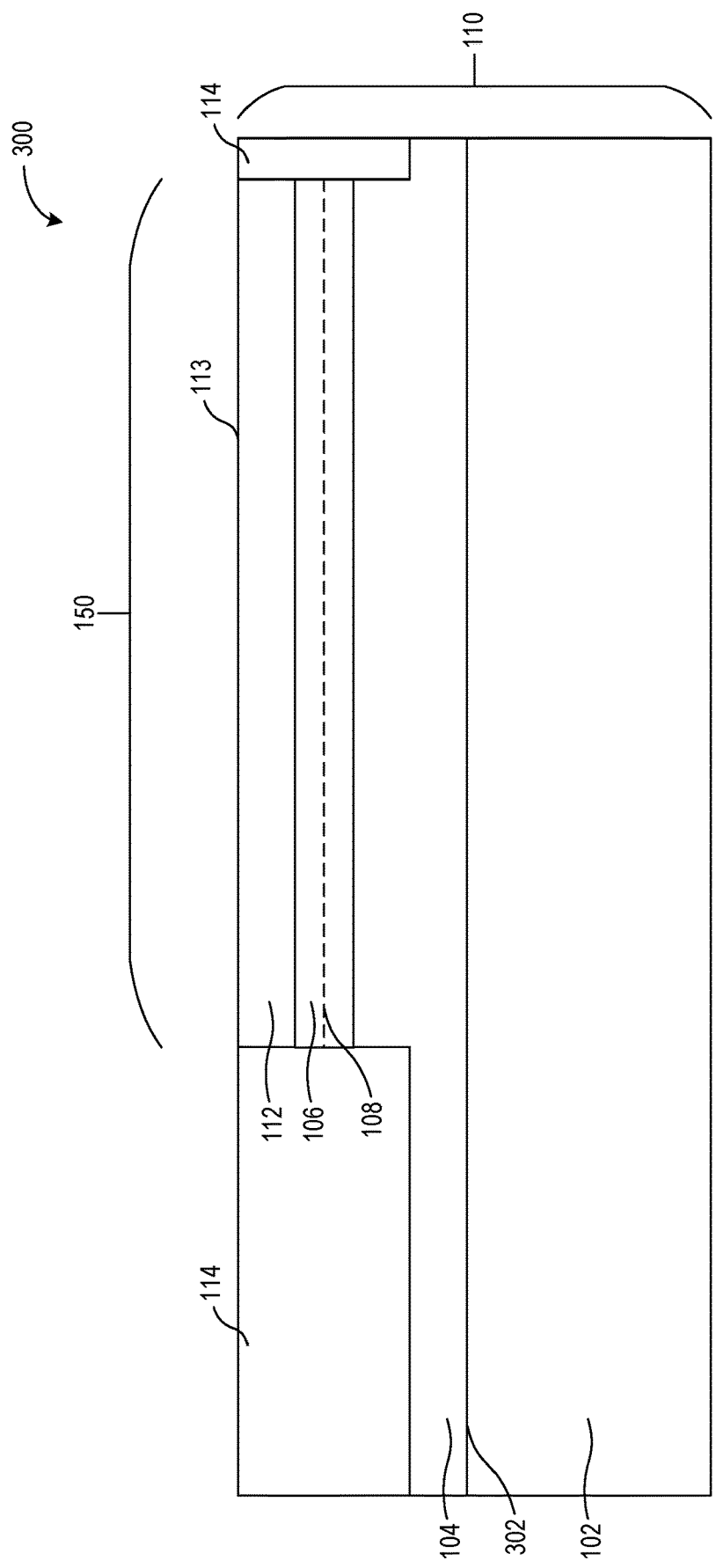
FIGS. 3-21 are cross-sectional views depicting the transistor devices of FIG. 1 at various stages of fabrication, in accordance with various embodiments.

Referring first to step 202 of FIG. 2 and to FIG. 3, at a first stage of fabrication 300, a semiconductor substrate 110 is provided, and an active region 150 is defined in the semiconductor substrate 110. As mentioned previously, the semiconductor substrate 110 may include a host semiconductor substrate 102 ("host substrate") and multiple layers overlying the host substrate 102. According to an embodiment, the layers overlying the host substrate 102 includes a buffer layer 104, a channel layer 106, and a barrier layer 112.

In an embodiment, the host substrate 102 includes an upper surface 302 and may be formed from silicon carbide (SiC). In other embodiments, the host substrate 102 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The buffer layer 104 may be formed on the upper surface 302 of host substrate 102. The buffer layer 104 may include one or more group III-nitride semiconductor layers. In some embodiments, the buffer layer 104 includes multiple layers of semiconductor material, where each of the layers of buffer layer 104 may include an epitaxially grown group-III nitride layer, for example. In such embodiments, the epitaxially grown group-III nitride layers of the buffer layer 104 may include nitrogen (N)-polar (i.e., N-face) or gallium (Ga)-polar (i.e., Ga-face) material, for example. In one or more other embodiments, the semiconductor layer(s) of the buffer layer 104 may not be epitaxially grown. In still other embodiments, the semiconductor layer(s) of the buffer layer 104 may include Si, GaAs, InP, or other suitable materials.

In some embodiments, the buffer layer 104 may include at least one AlGaN mixed crystal layer having a composition denoted by $Al_xGa_{1-x}N$ with an aluminum mole fraction, X, that can take on values between 0 and 1. The total thickness of buffer layer 104, including all of its constituent layers, may be between about 100 angstroms and about 100,000 angstroms although other thicknesses may be used. A limiting X value of 0 yields pure GaN while a value of 1 yields pure aluminum nitride (AlN). In an embodiment, the buffer layer 104 may include a nucleation region comprised of AlN. The nucleation region starts at the interface between the host substrate 102 and buffer layer 104 and may extend about 100 angstroms to about 1,000 angstroms into buffer layer 104. The buffer layer 104 may include additional $Al_xGa_{1-x}N$ layers formed over the nucleation region. The thickness of the additional $Al_xGa_{1-x}N$ layer(s) may be between about 100 angstroms and about 50,000 angstroms though other thicknesses may be used. In an embodiment, the additional $Al_xGa_{1-x}N$ layer(s) may be configured as GaN layer(s) (X=0) where the $Al_xGa_{1-x}N$ layer(s) are not intentionally doped (NID). Alternatively, the additional $Al_xGa_{1-x}N$ layer(s) may be configured as one or more GaN layers where the one or more GaN layers are intentionally doped with dopants that may include iron (Fe), chromium (Cr), carbon (C) or other suitable dopants that render buffer layer 104 substantially insulating or highly resistive. The dopant concentration may be between about $10^{17}$ cm$^{-3}$ and $10^{19}$ cm$^{-3}$ though other higher or lower concentrations may be used. The additional $Al_xGa_{1-x}N$ layers may be configured with X=0.01 to 0.10 where the $Al_xGa_{1-x}N$ is NID or, alternatively, where the $Al_xGa_{1-x}N$ is intentionally doped with Fe, Cr, C, a combination of these, or other suitable dopant species. In one or more other embodiments, the additional $Al_xGa_{1-x}N$ layers may be configured as a super-lattice where the additional $Al_xGa_{1-x}N$ layers include a series of alternating NID or doped $Al_xGa_{1-x}N$ layers where the value of X takes a value between 0 and 1. In still other embodiments, buffer layer 104 may include one or more indium gallium nitride (InGaN) layers, with composition denoted $In_YGa_{1-Y}N$, where Y, the indium mole fraction, may take a value between 0 and 1. The thickness of the InGaN layer(s) may be between about 10 angstroms and about 1,000 angstroms though other thicknesses may be used.

In an embodiment, the channel layer 106 may be formed over buffer layer 104. The channel layer 106 may include one or more group III-nitride semiconductor layers. The channel layer 106 may include an $Al_xGa_{1-x}N$ layer where X takes on values between 0 and 1. In an embodiment, the channel layer 106 is configured as GaN (X=0) although other values of X may be used. The thickness of the channel layer 106 may be between about 50 angstroms and about 10,000 angstroms, though other thicknesses may be used. The channel layer 106 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 106 may include NID or doped $In_YGa_{1-Y}N$, where Y, the indium mole fraction, may take a value between 0 and 1.

The barrier layer 112 may be formed over the channel layer 106, in accordance with an embodiment. The barrier layer 112 may include one or more group III-N semiconductor layers. The barrier layer 112 may have a larger bandgap and/or larger spontaneous polarization than the channel layer 106 and, when the barrier layer 112 is over channel layer 106, the channel 108 may be created in the form of a two-dimensional electron gas (2-DEG) within channel layer 106 adjacent the interface between the channel layer 106 and the barrier layer 112. In addition, tensile strain between the barrier layer 112 and channel layer 106 may cause additional piezoelectric charge to be introduced into the 2-DEG and the channel 108. The barrier layer 112 may include a multi-layer structure, where the first layer of the barrier layer 112 may include at least one NID $Al_xGa_{1-x}N$ layer where X takes on values between 0 and 1. In some embodiments, X may take a value of 0.1 to 0.35, although other values of X may be used. The thickness of the first layer of the barrier layer 112 may be between about 50 angstroms and about 1,000 angstroms though other thicknesses may be used. The barrier layer 112 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used.

An additional AlN interbarrier layer (not shown) may be formed between the channel layer 106 and the barrier layer 112, in some embodiments. The AlN interbarrier layer may introduce additional spontaneous and piezoelectric polarization, increasing the channel charge and improving the electron confinement of the resultant 2-DEG that forms the channel 108.

In other embodiments, the barrier layer 112 may include one or more indium aluminum nitride (InAlN) layers, denoted In$_Y$Al$_{1-Y}$N, where Y, the indium mole fraction, may take a value between about 0.1 and about 0.2 though other values of Y may be used. In the case of using InAlN to form the barrier layer 112, the thickness of the barrier layer 112 may be between about 50 angstroms and about 1,000 angstroms though other thicknesses may be used. In the case of using InAlN to form the barrier layer 112, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

In some embodiments, a cap layer (not shown) may be formed over the barrier layer 112. When included, the cap layer presents a stable surface for the substrate 110 and serves to protect the upper surface 113 of the substrate 110 from chemical and environmental exposure incidental to wafer processing. The cap layer may include one or more group III-N semiconductor layers and is supported by the barrier layer 112. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

The isolation regions 114 may be formed via an implantation procedure configured to damage the epitaxial and/or other semiconductor layers to create high resistivity regions of the substrate 110, rendering the substrate 110 high resistivity or semi-insulating in the high resistivity regions while leaving the crystal structure intact in the active region 150. In other embodiments (not shown), one or more of the isolation regions 114 may be formed by removing portions of one or more of the epitaxial and/or other semiconductor layers of the substrate 110 and leaving behind active region "mesas", such as the active region 150, surrounded by the isolation regions 114 (i.e., surrounded by regions of high resistivity or semi-insulating material). The transistor 101 of FIG. 1 may subsequently be formed within the active region 150.

Figure 4:
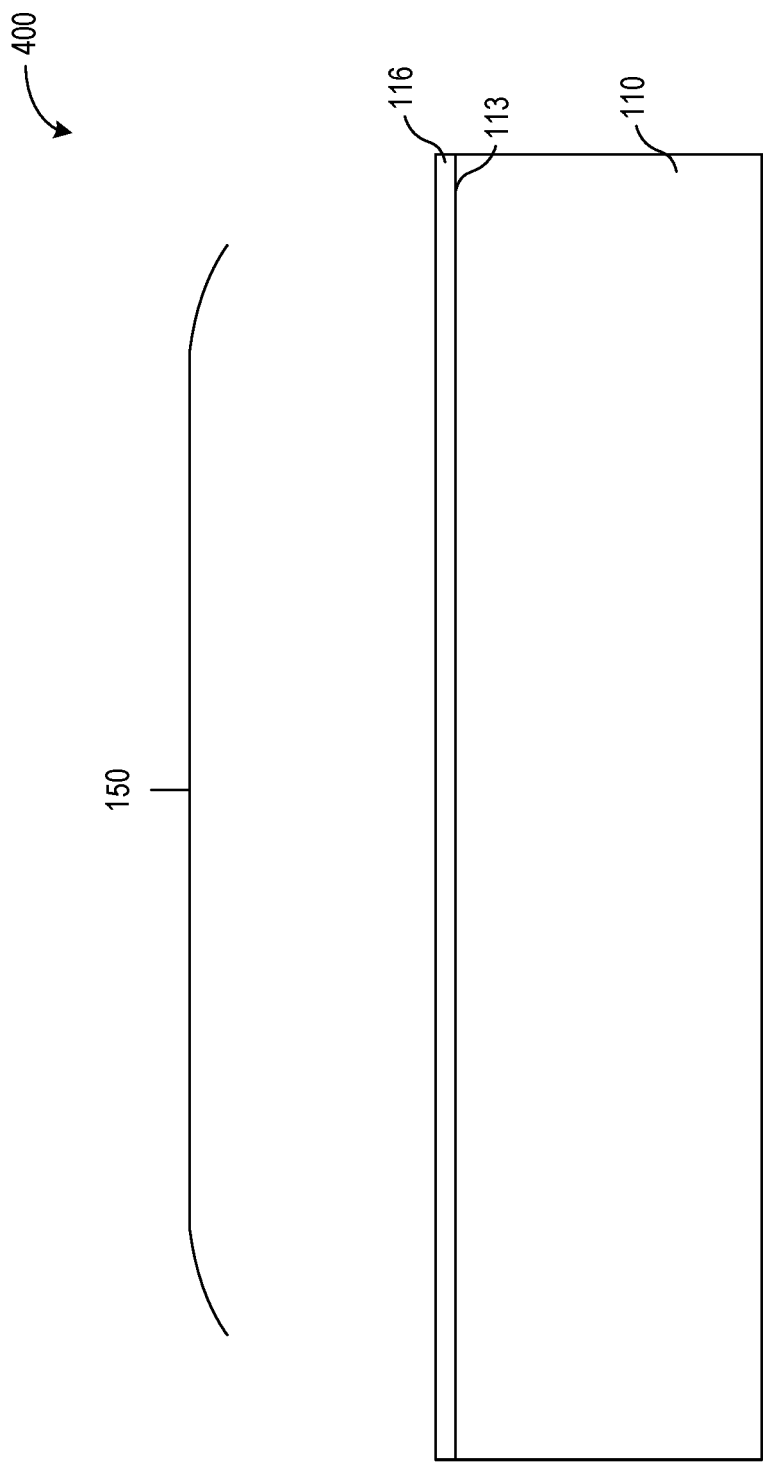

Referring next to step 204 of FIG. 2 and to FIG. 4, during a stage of fabrication 400, a first dielectric layer 116 is formed on the upper surface 113 of the semiconductor substrate 110. As mentioned above, in one or more embodiments, the first dielectric layer 116 may have a thickness in a range of about 300 angstroms to about 1,500 angstroms. The first dielectric layer 116 may be formed from dielectric material, such as Al$_2$O$_3$, SiN, Si$_3$N$_4$, SiO$_2$, SiON, AlN, SiAlN, HfO$_2$, ZrO$_2$, TiO$_2$, or another suitable material, which may be deposited via chemical vapor deposition (e.g., LPCVD) as a non-limiting example. In an example embodiment, the first dielectric layer 116 may include a nitride (e.g., SiN, AlN, SiAlN as non-limiting examples).

Figure 5:
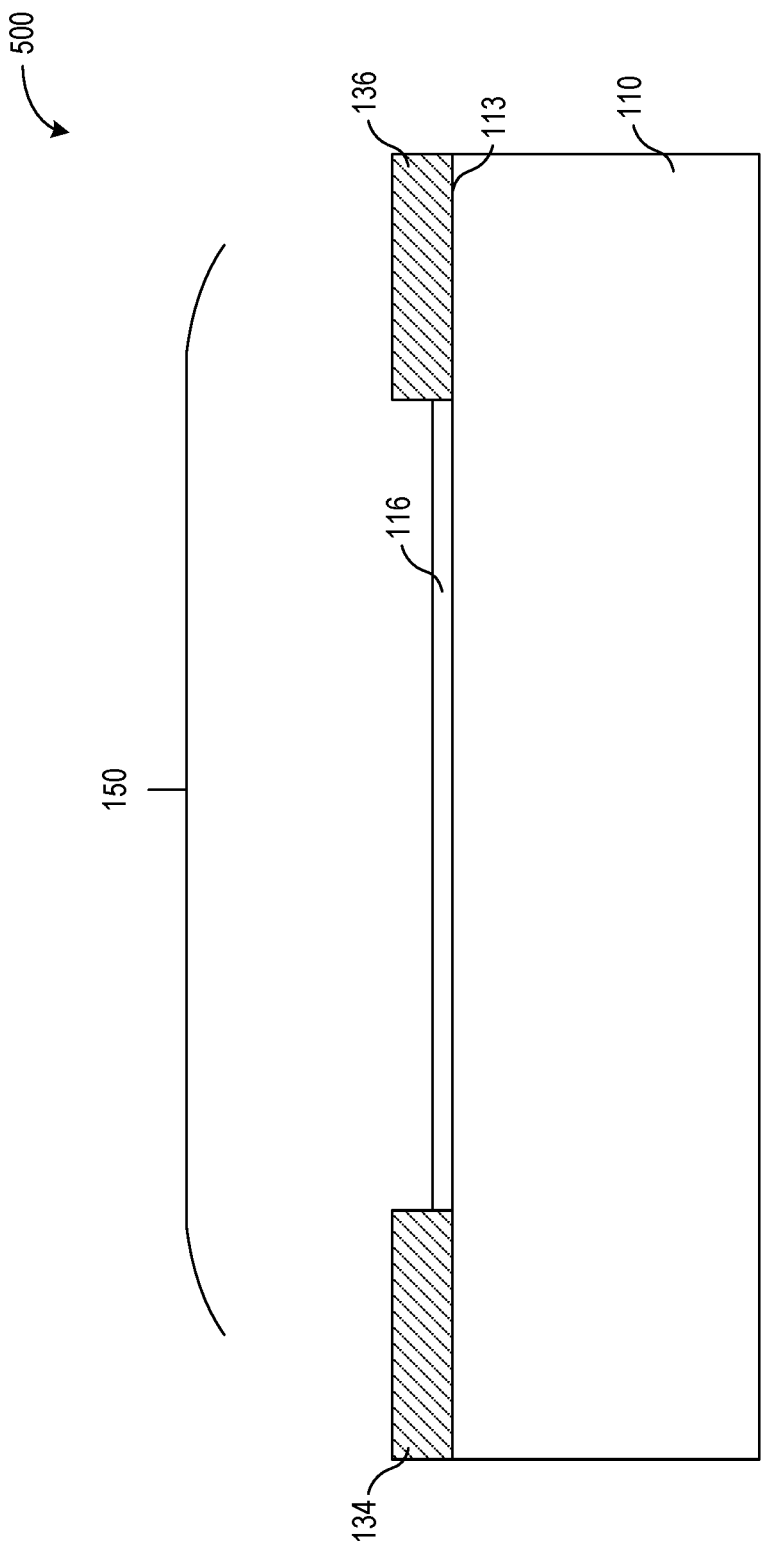

Referring next to step 206 of FIG. 2 and to FIG. 5, during a stage of fabrication 500, ohmic contact structures 134, 136 are formed on the surface 113 of the substrate 110. For example, portions of the first dielectric layer 116 may be removed via one or more selective (e.g., patterned) etch processes, which may be performed in conjunction with a corresponding photolithographic process to expose portions of the upper surface 113 of the substrate 110. One or more layers of conductive material (e.g., one or more layers of any of Ti, Al, W, nickel (Ni), Molybdenum (Mo), gold (Au), or other suitable conductive materials as non-limiting examples) may be deposited (e.g., via sputtering, evaporation, or chemical vapor deposition as non-limiting examples) over the substrate 110, including portions that directly contact the exposed portions of the upper surface 113 of the substrate 110. Portions of the conductive layer(s) that do not overlap the previously exposed portions of the upper surface 113 of the substrate 110 (e.g., portions disposed on or over the first dielectric layer 116) may then be removed via a suitable etch process or lift-off process. Respective portions of each of the ohmic contact structures 134, 136 may be disposed over the channel 108.

Figure 6:
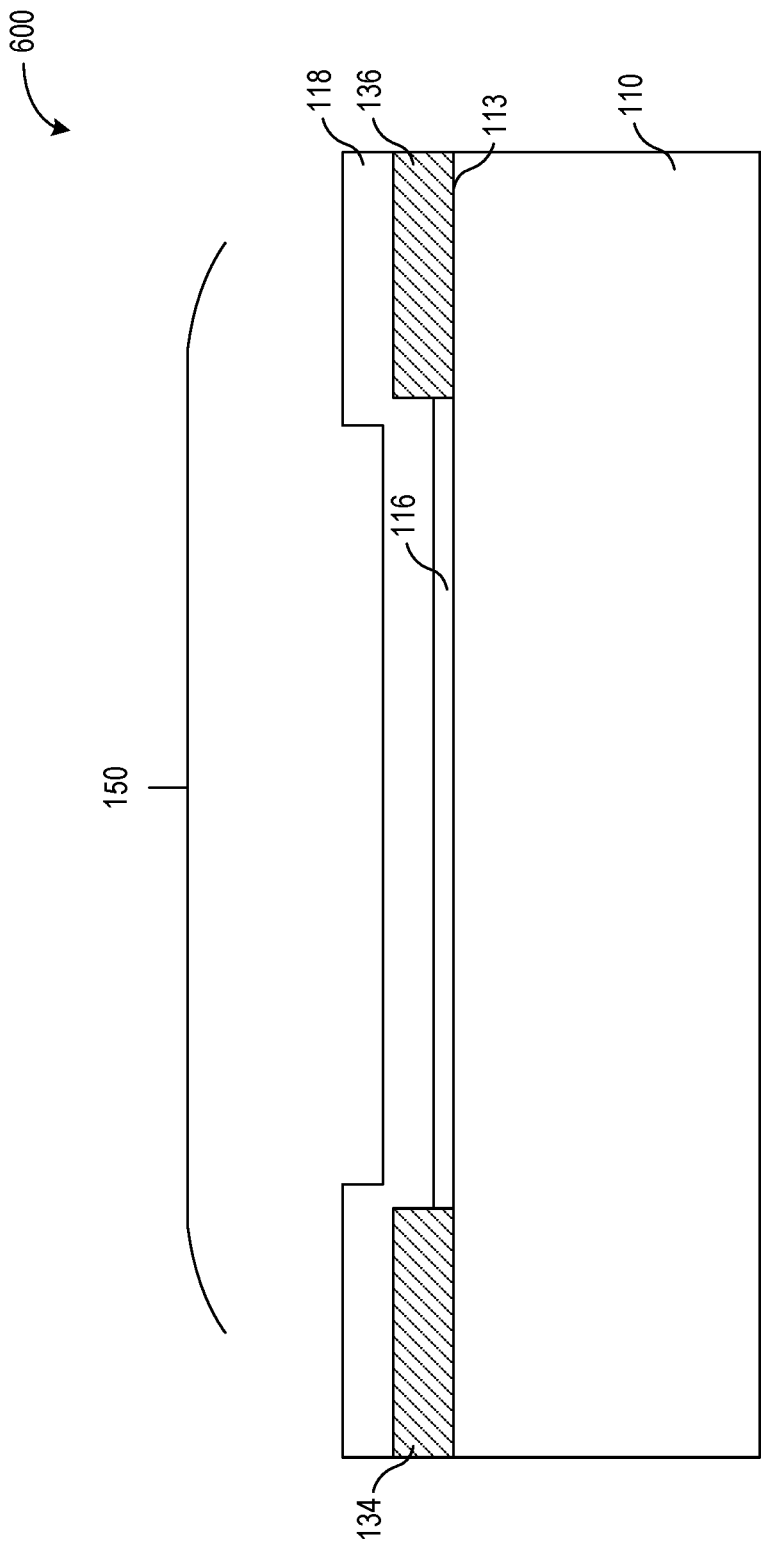

Referring next to step 208 of FIG. 2 and to FIG. 6, during a stage of fabrication 600, a second dielectric layer 118 is formed on the first dielectric layer 116 and the ohmic contact structures 134, 136. As mentioned above, in one or more embodiments, the second dielectric layer 118 may have a thickness in a range of about 100 angstroms to about 4,000 angstroms. The second dielectric layer 118 may be formed from dielectric material, such as Al$_2$O$_3$, SiN, Si$_3$N$_4$, SiO$_2$, SiON, AlN, SiAlN, HfO$_2$, ZrO$_2$, TiO$_2$, or another suitable material, which may be deposited via plasma enhanced chemical vapor deposition (e.g., PECVD) as a non-limiting example. In an example embodiment, the second dielectric layer 118 may include an oxide (e.g., SiO$_2$, ZrO$_2$, HfO$_2$, Al$_2$O$_3$, or TiO$_2$ as non-limiting examples).

Figure 7:
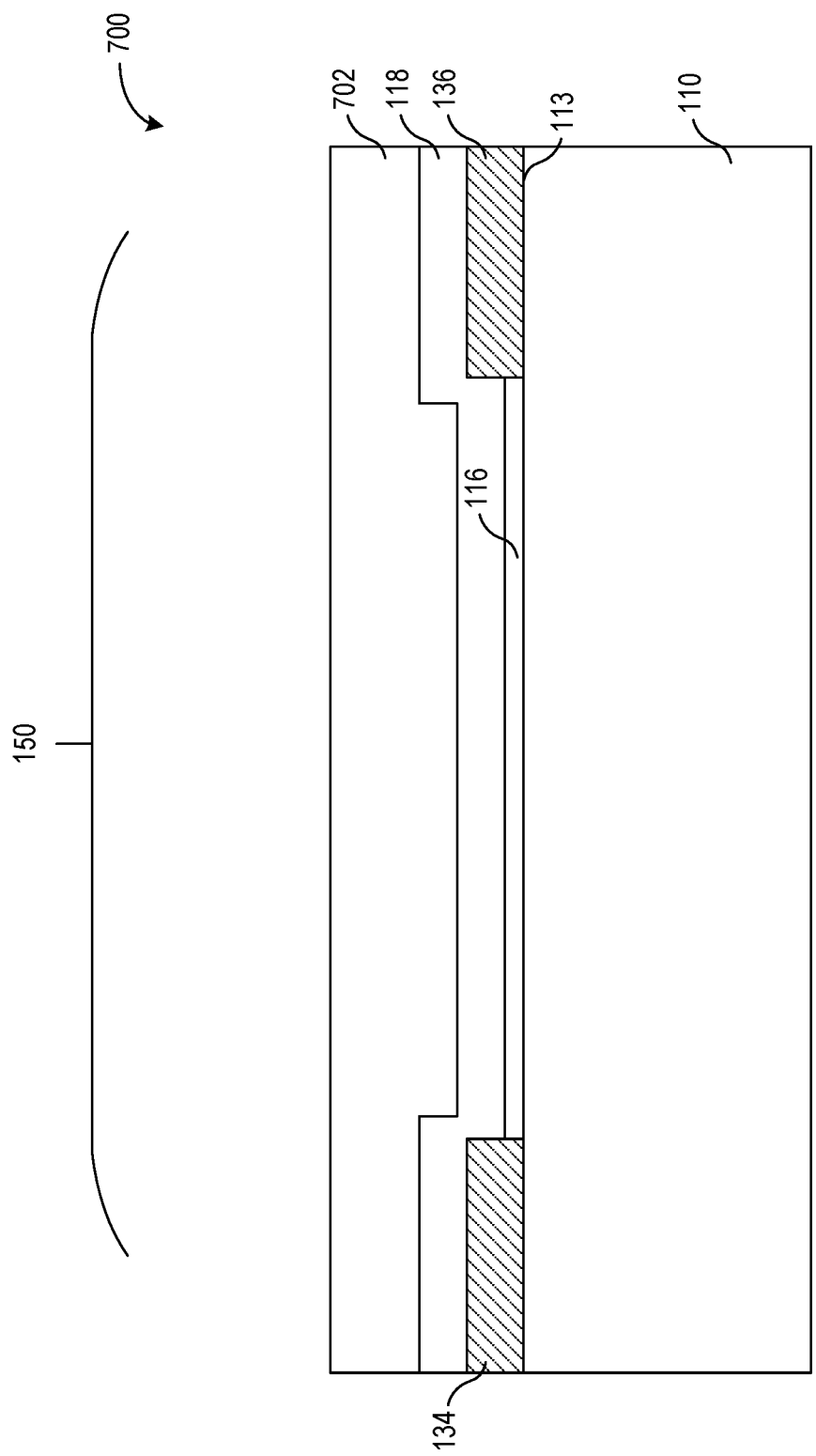
Figure 8:
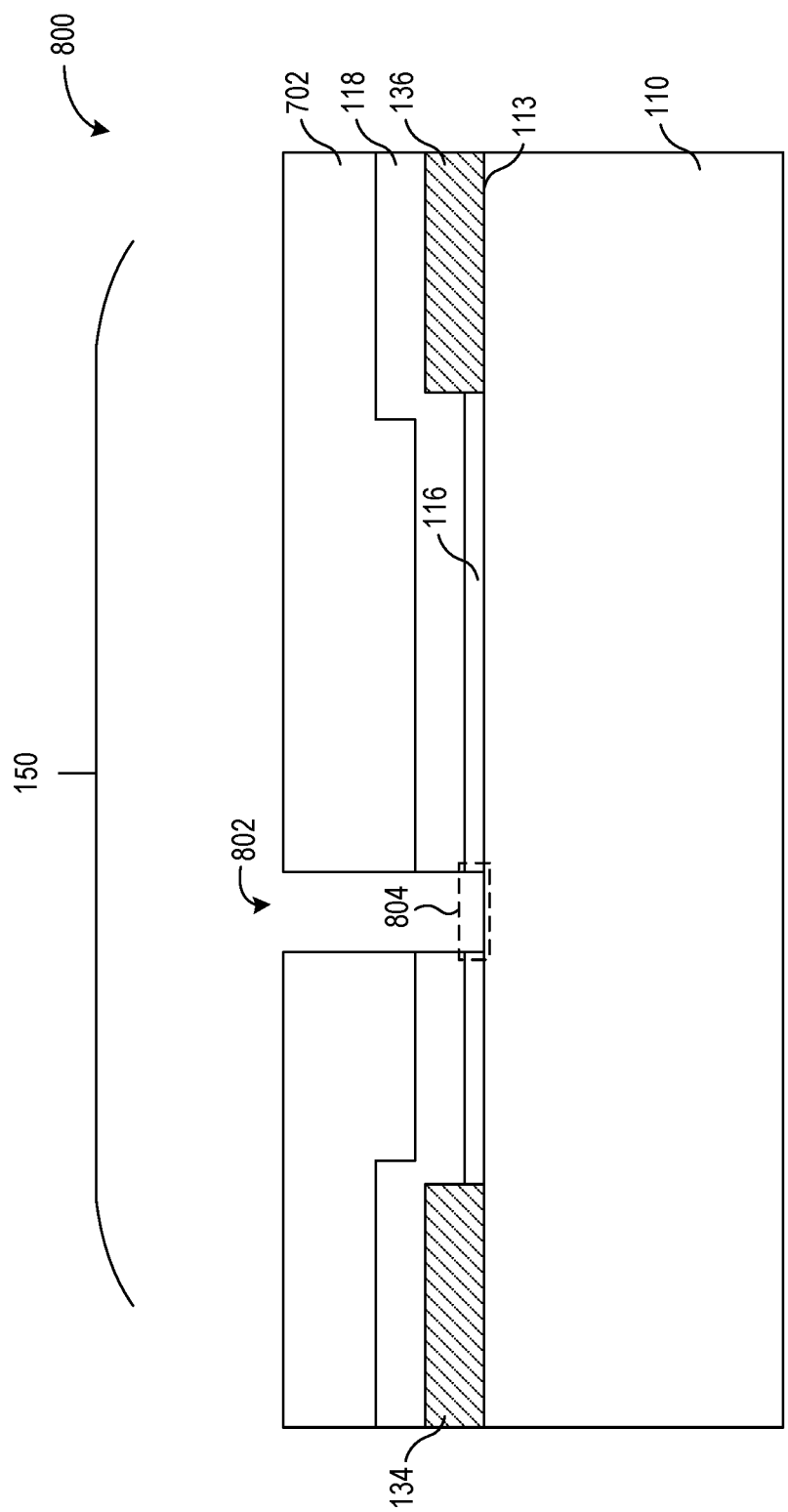

Referring next to step 210 of FIG. 2 and to FIGS. 7 and 8, during stages of fabrication 700, 800, portions of the first dielectric layer 116 and the second dielectric layer 118 are selectively etched to form a gate channel 804. For example, during the stage of fabrication 700, a photoresist layer 702 is formed (e.g., via spin coating) on the second dielectric layer 118. A patterned mask is then applied over the photoresist layer 702 to selectively portions of the photoresist layer 702 to light (e.g., ultraviolet (UV) light). Then, at the stage of fabrication 800 an opening 802 is formed through the photoresist layer 702, the second dielectric layer 118, and the first dielectric layer 116 by first applying developer solution to remove portions of the photoresist layer 702, thereby forming an opening in the photoresist layer 702, then etching portions of the second dielectric layer 118 and the first dielectric layer 116 through the opening in the photoresist layer 702. For example, these portions of the second dielectric layer 118 and the first dielectric layer 116 may be etched using a single etch process or two separate etch processes, where each etch process may be a wet chemical etch process (e.g., a BOE process, a phosphoric acid etch process, another suitable etch process, or a combination thereof), an anisotropic dry etch process (e.g., one or more RIE processes), or a combination thereof.

Figure 9:
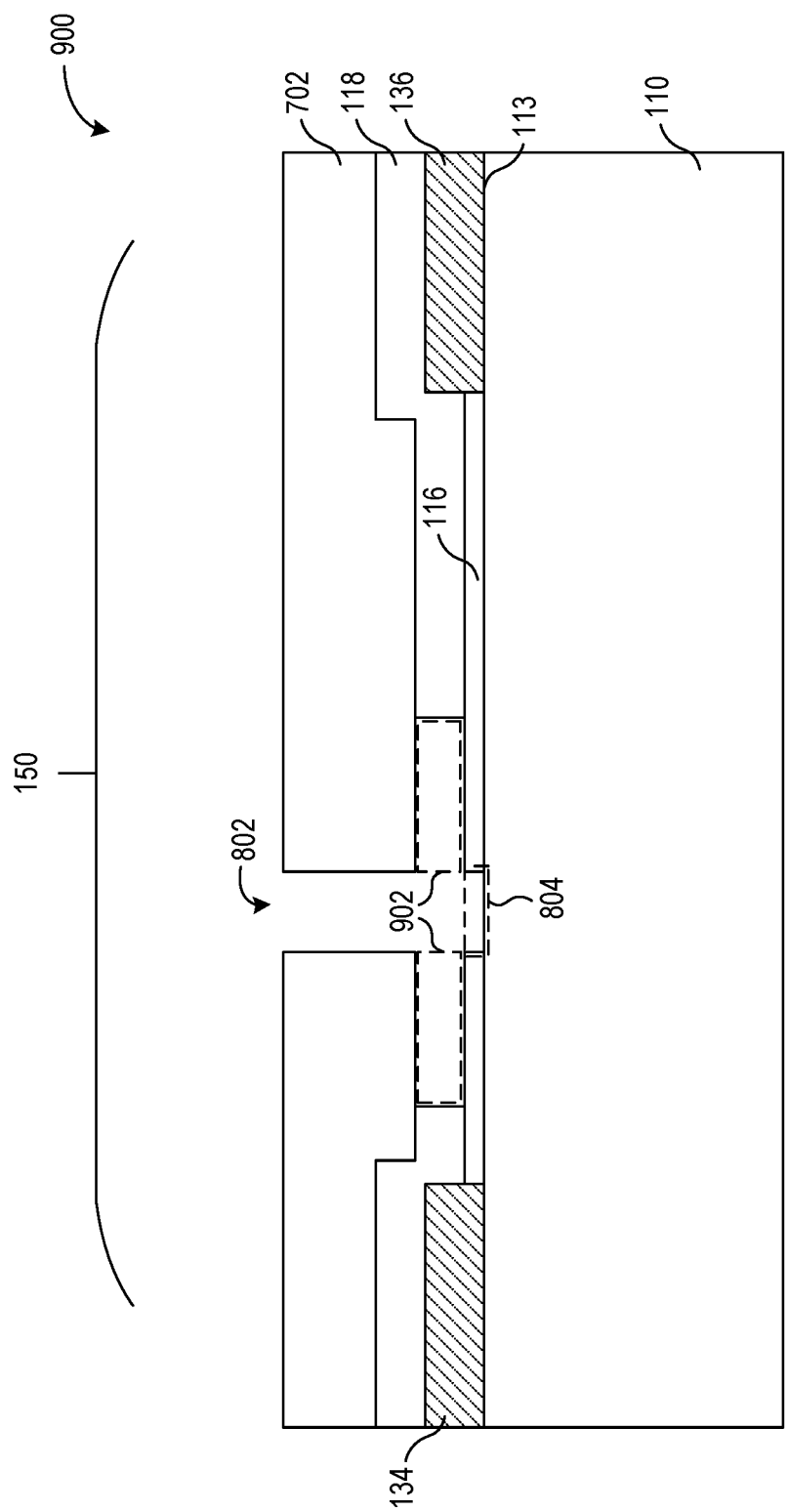

Referring next to step 212 of FIG. 2 and to FIG. 9, during a stage of fabrication 900, additional portions 902 of the second dielectric layer 118 are removed. In one or more embodiments, the portions 902 of the second dielectric layer 118 are removed by performing either a wet etch process or an isotropic dry etch process, where the performed etch process is selective to (i.e., has a comparatively higher etch rate with respect to) the dielectric material of the first dielectric layer 116. In one or more embodiments, removal of the additional portions 902 may be performed without first removing the photoresist layer 702, such that the etch process undercuts the photoresist layer 702 when removing the additional portions 902.

In one or more other embodiments, at the stage of fabrication 800 of FIG. 8, the opening 802 instead may be formed through only the photoresist layer 702 and the second dielectric layer 118, then, at the stage of fabrication 900 of FIG. 9, the additional portions 902 of the second dielectric layer 118 may be removed via isotropic wet or dry etching (undercutting the photoresist layer 702). Then, in another stage of fabrication (not shown), gate channel 804 may be formed by selectively etching a portion of the first dielectric layer 116 using an etch process (e.g., an anisotropic etch process such as an RIE process or an isotropic etch process such as a wet etch process, according to various embodiments) that is the same as or that is different from the etch process used to remove the additional portions 902 of the second dielectric layer 118. In one or more such embodiments, etching the second dielectric layer 118 and the first dielectric layer 116 using two separate etch processes when forming the gate channel 804 may reduce plasma damage to the surface 113 of the substrate 110 (e.g., if respective plasma dry etch processes are performed when exposing the surface 113 during formation of the gate channel 804 and removing the additional portions 902).

In one or more other embodiments, rather than removing the additional portions of the second dielectric layer 118 via undercutting the photoresist layer 702, two separate patterned etch processes may be performed—a first patterned etch process to remove the portions 902 of the second dielectric layer 118 and portions of the second dielectric layer 118 that overlap the region in which the gate channel 804 is to be formed, then a second patterned etch process to remove portions of the first dielectric layer 116 to form the gate channel 804.

Removing the additional portions 902 of the second dielectric layer 118 may allow the gate structure 128 to be formed closer to the surface 113 of the substrate in one or more embodiments. In one or more other embodiments (e.g., an embodiment of the transistor device 2200 of FIG. 22), removal of the additional portions 902 may be omitted if, for example, the first dielectric layer 116 and the second dielectric layer 118 are each sufficiently thin (e.g., if the combined thickness of the first dielectric layer 116 and the second dielectric layer 118 is less than 1,500 angstroms).

Figure 10:
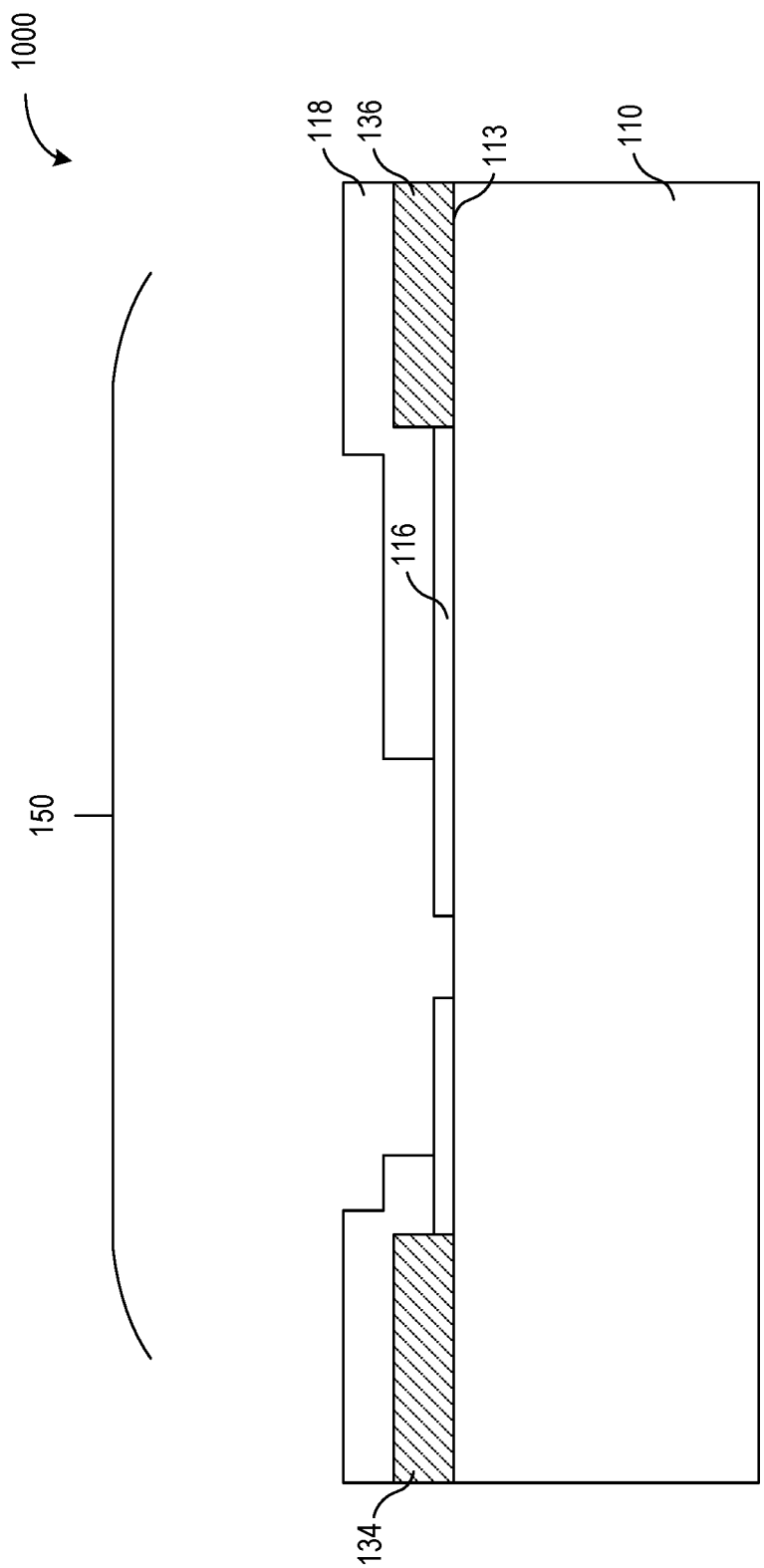
Figure 11:
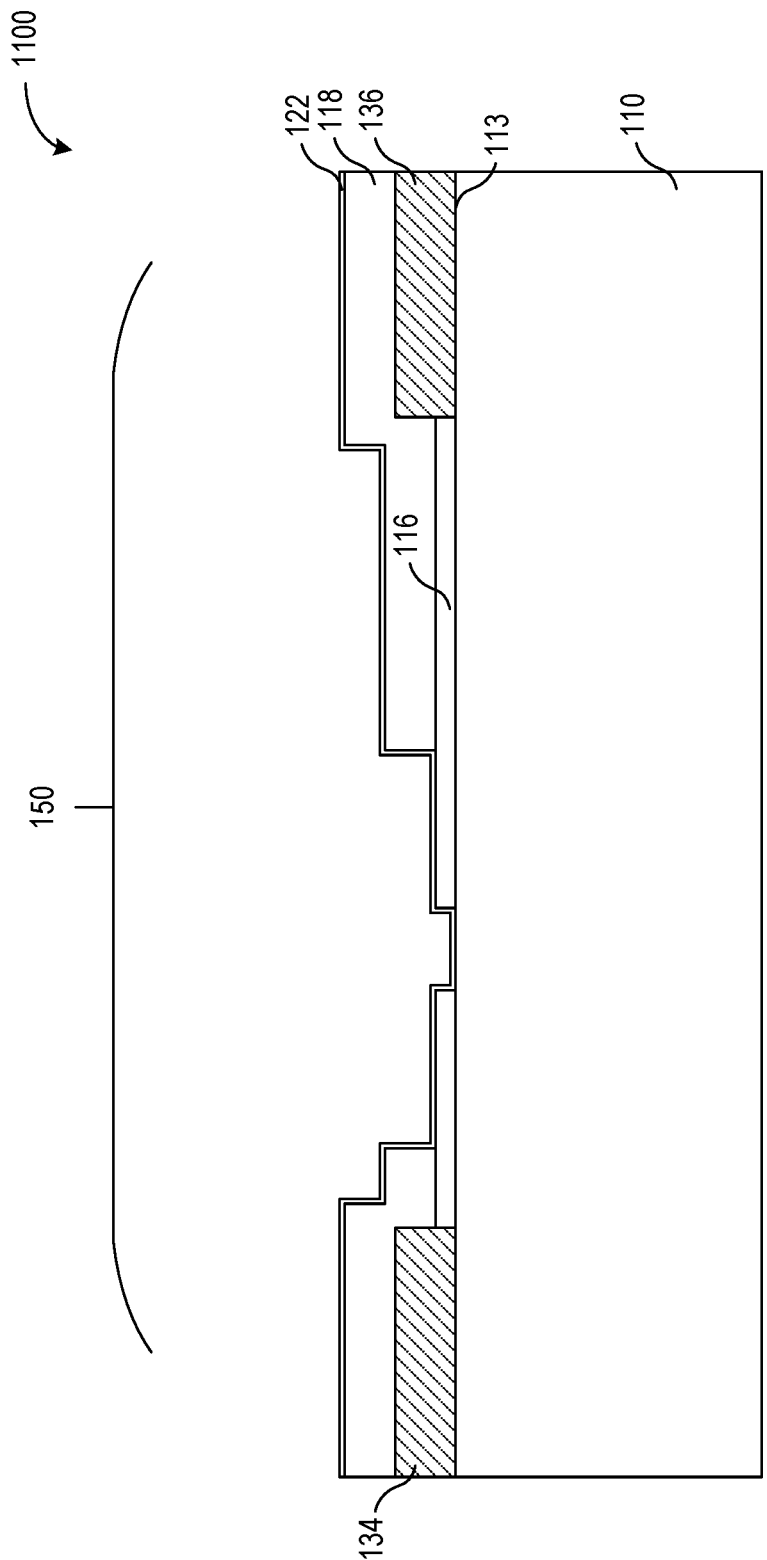

Referring next to FIG. 10, at a stage of fabrication 1000, the photoresist layer 702 is removed to expose upper surfaces of the second dielectric layer 118. In some conventional fabrication techniques for transistor devices, metal layers are exposed during gate channel formation, which undesirably allows material from such metal layers to introduce defects in the exposed surface of the substrate in the gate channel. In the present example, in contrast, the ohmic contact structures 134, 136 are covered by the second dielectric layer 118, which mitigates (or, in some instances, prevents) the migration of such defects from the ohmic contact structures 134, 136 to the exposed surface 113 of the substrate 110 in the gate channel 804. In this way the likelihood of defects being introduced in the region of the gate channel 804 is advantageously reduced, which may improve performance of the transistor device 100 and may improve chip yield Referring next to step 214 of FIG. 2 and to FIG. 11, at a stage of fabrication 1100, a third dielectric layer 122 is deposited over respective portions of the upper surface 113 of the substrate 110 (e.g., the exposed portion of the upper surface 113 that is disposed in the gate channel 804), the first dielectric layer 116, and the second dielectric layer 118. As mentioned above, the third dielectric layer 122 may have a thickness of less than 100 angstroms, such as a thickness of between around 10 and around 100 angstroms as a non-limiting example. The third dielectric layer 122 may be formed from dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via atomic layer deposition (e.g., ALD) as a non-limiting example. In an example embodiment, the third dielectric layer 122 may be include oxide (e.g., $SiO_2$, $ZrO_2$, $HfO_2$, $Al_2O_3$, or $TiO_2$ as non-limiting examples).

Figure 12:
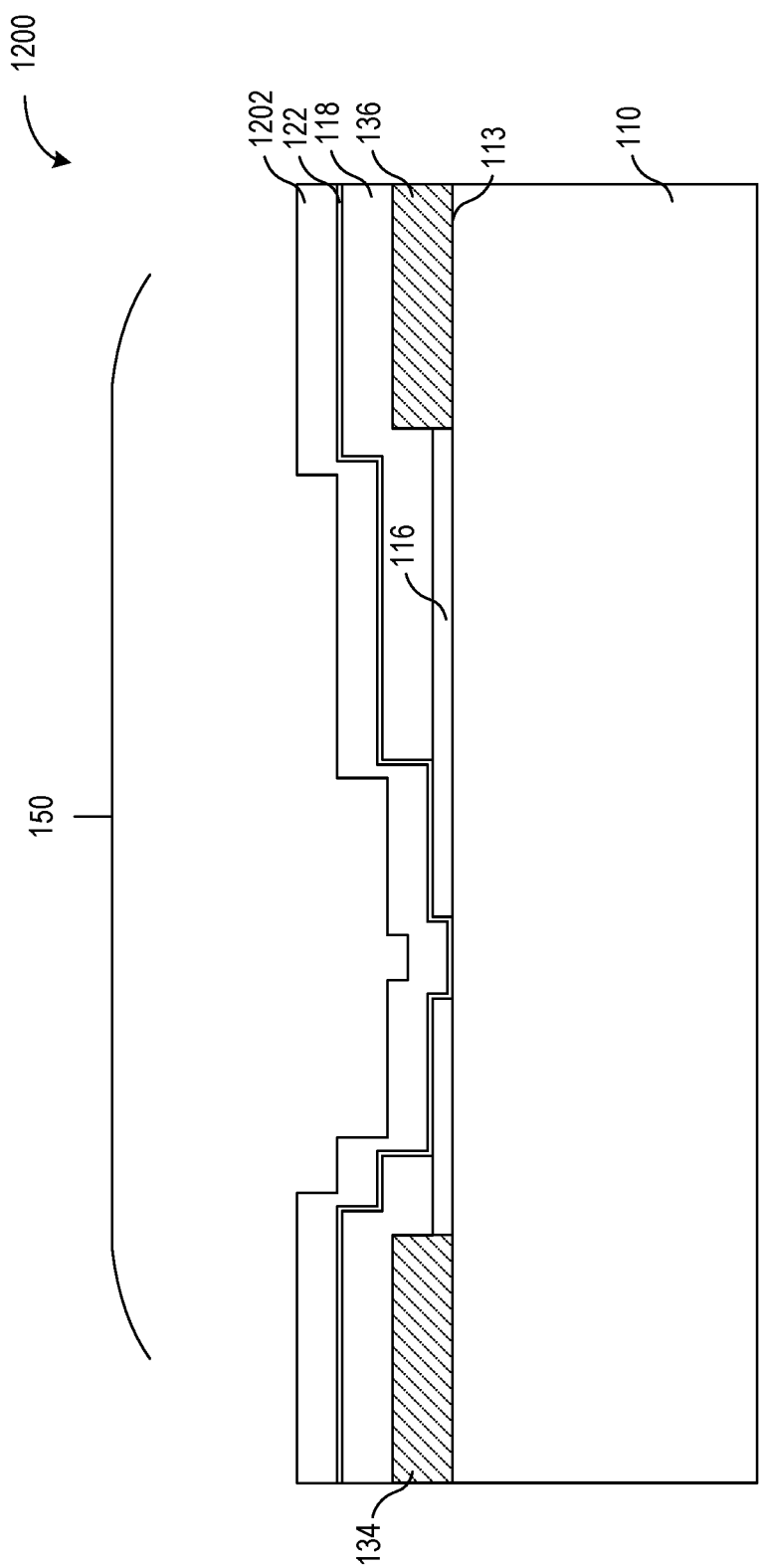

Referring next to step 216 of FIG. 2 and to FIG. 12, at a stage of fabrication 1200, a spacer layer 1202 is formed over the third dielectric layer 122. In one or more embodiments, the spacer layer 1202 may include dielectric material, such as $Al_2O_3$, SiN, $Si_3N_4$, $SiO_2$, SiON, AlN, SiAlN, $HfO_2$, $ZrO_2$, $TiO_2$, or another suitable material, which may be deposited via chemical vapor deposition (e.g., LPCVD) as a non-limiting example. In an example embodiment, the spacer layer 1202 may include a nitride (e.g., SiN, AlN, SiAlN, as non-limiting examples).

Figure 13:
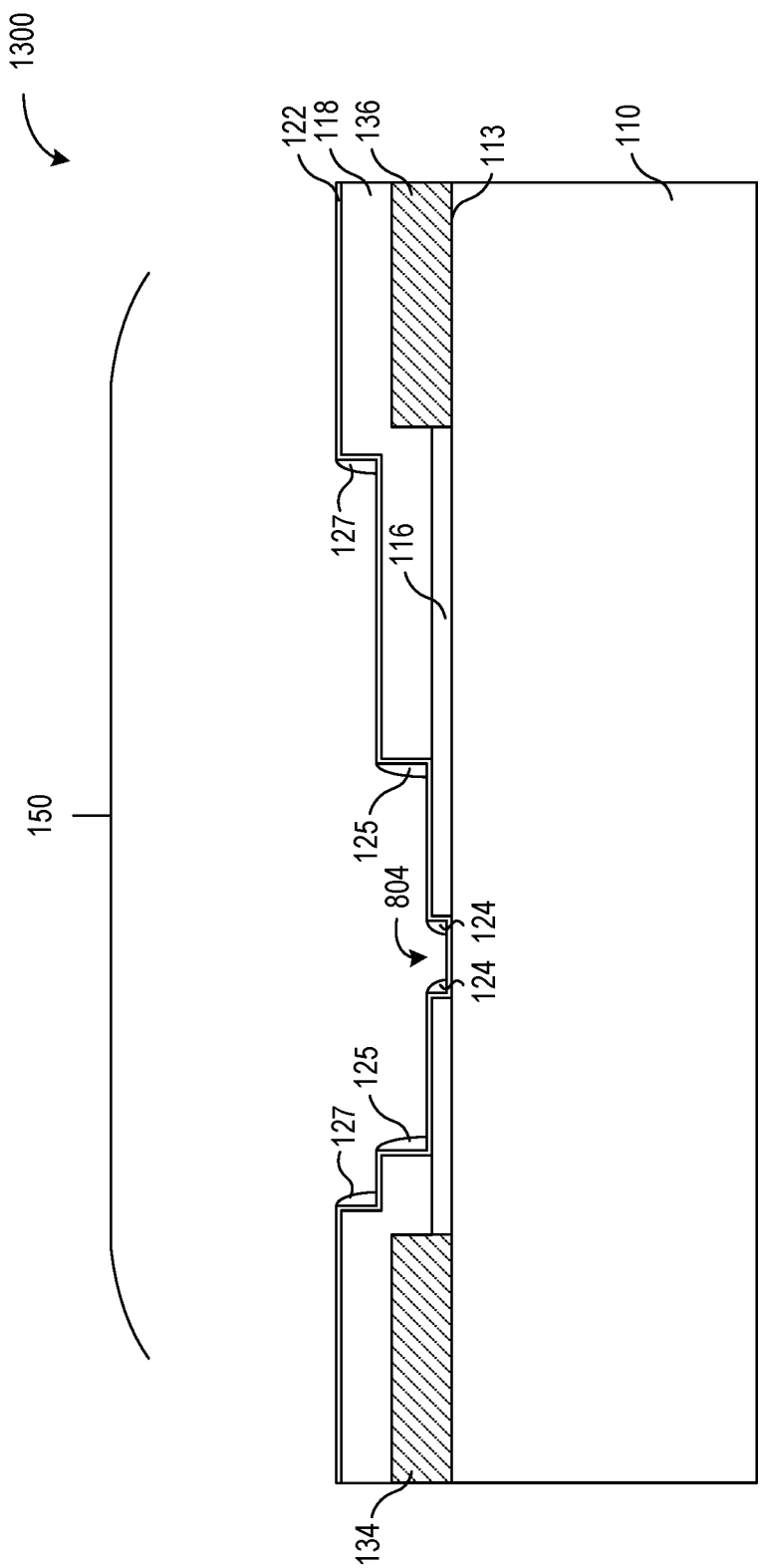

Referring next to step 218 of FIG. 2 and to FIG. 13, at a stage of fabrication 1300, the spacer layer 1202 is etched to form spacer structures 124, 125, 127. For example, an anisotropic etch process (e.g., an RIE process as a non-limiting example) may be performed to etch away portions of the spacer layer 1202, where portions of the spacer layer 1202 that remain after the anisotropic etch process form the spacer structures 124, 125, 127. As shown, the spacer structures 124 are disposed in the gate channel 804. Each of the spacer structures 124, 125, 127 may be disposed at respective side walls of the third dielectric layer 122. The respective widths of each of the spacer structures 124, 125, 127 may correspond to the thickness of the spacer layer 1202 (e.g., with a thicker spacer layer 1202 corresponding to wider spacer structures 124, 125, 127 and a thinner spacer layer 1202 corresponding to less wide spacer structures 124, 125, 127). Thus, the widths of the spacer structures 124, 125, 127 may be set based on the amount of dielectric material deposited when forming the spacer layer 1202.

In this way, the gate length of the transistor device 100 may be adjusted by adjusting the thickness of dielectric material deposited when forming the spacer layer 1202. For example, forming a thicker spacer layer 1202 results in wider spacer structures 124, which reduces the gate length of the subsequently formed gate structure 128. In some instances, by forming sufficiently wide spacer structures 124, a gate length of the bottom of gate electrode 128 may be achieved that is not otherwise achievable using only conventional photolithographic techniques. Similarly, the widths of the spacer structures 125, 127 may be adjusted by adjusting the thickness of the spacer layer 1202, which may cause corresponding changes in the dimensions of the ILD layer 130 and field plate 135 formed in subsequent stages of fabrication.

Figure 14:
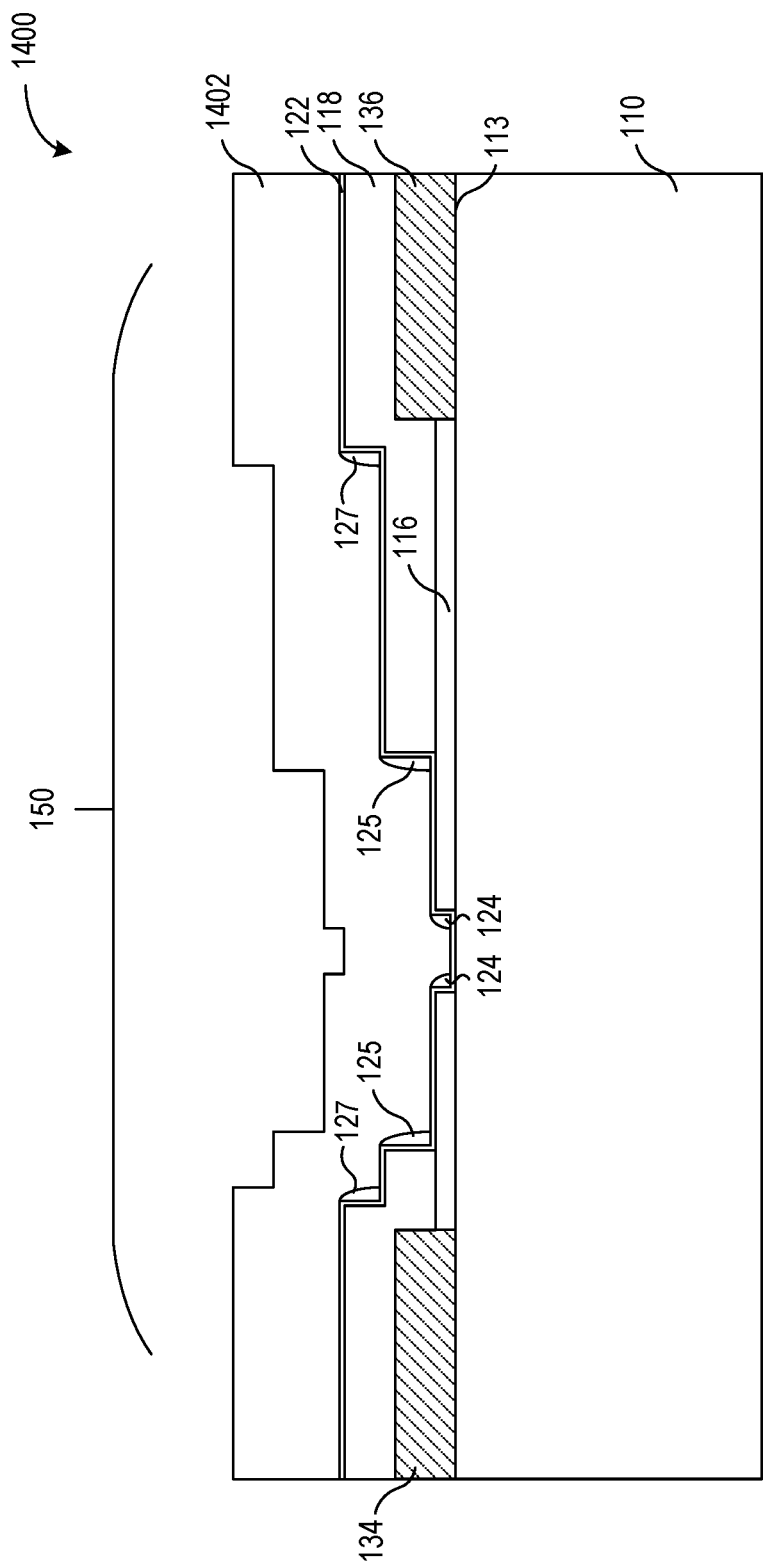
Figure 15:
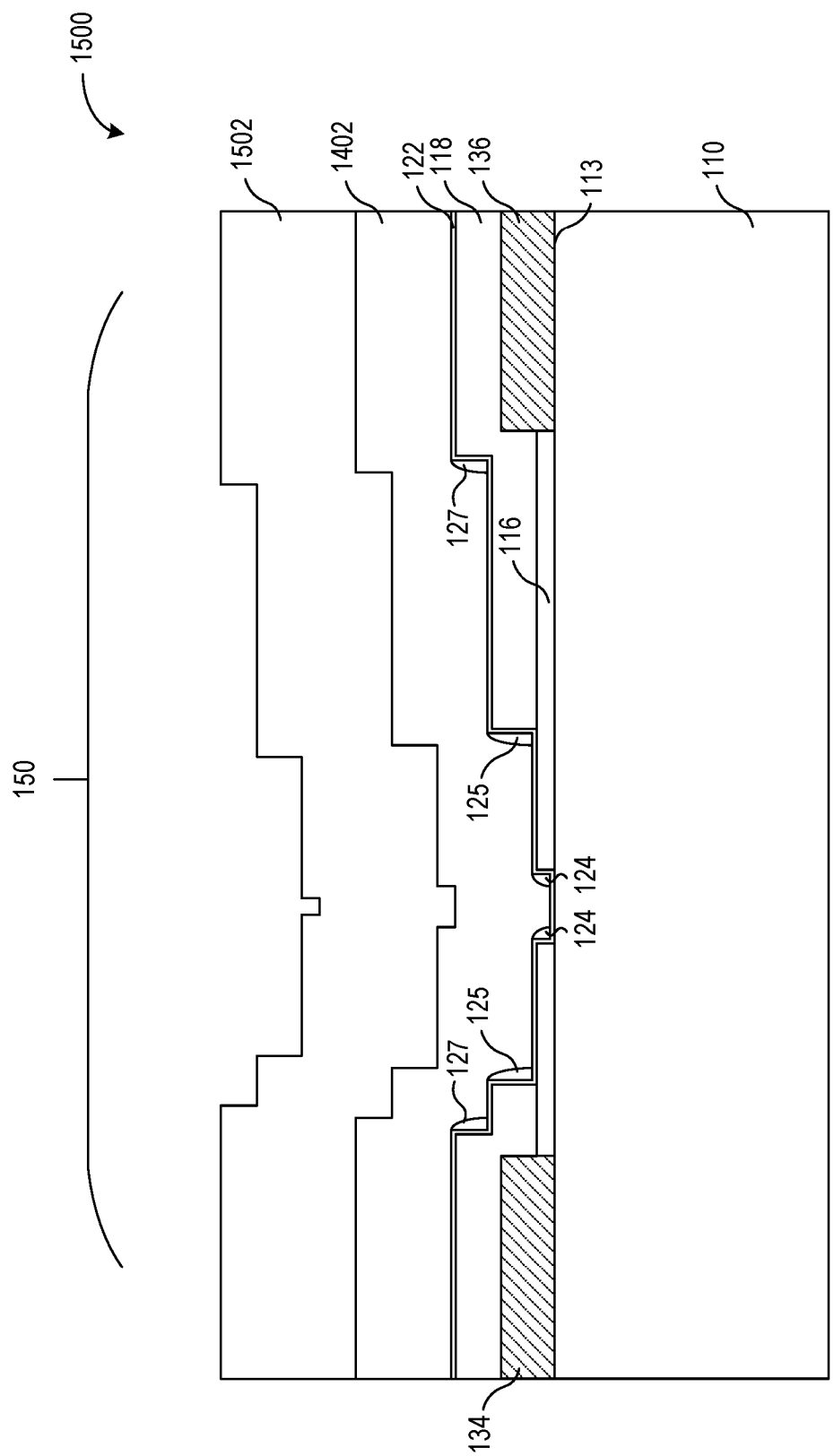

Referring next to step 220 of FIG. 2 and to FIGS. 14 and 15, at a stage of fabrication 1400, a first photoresist layer 1402 is formed over the substrate 110 (e.g., via spin coating)

and, at a stage of fabrication 1500, a second photoresist layer 1502 is formed on the first photoresist layer 1402 (e.g., via spin coating). In an example embodiment, the first photoresist layer 1402 may have a thickness of around 0.5 um to around 2 um, although it should be understood that other suitable thicknesses (e.g., thicker than the height of the gate structure 128) may be used. In an example embodiment, the second photoresist layer 1502 may have a thickness of around 0.25 um to around 1.5 um although other suitable thicknesses may be used.

Figure 16:
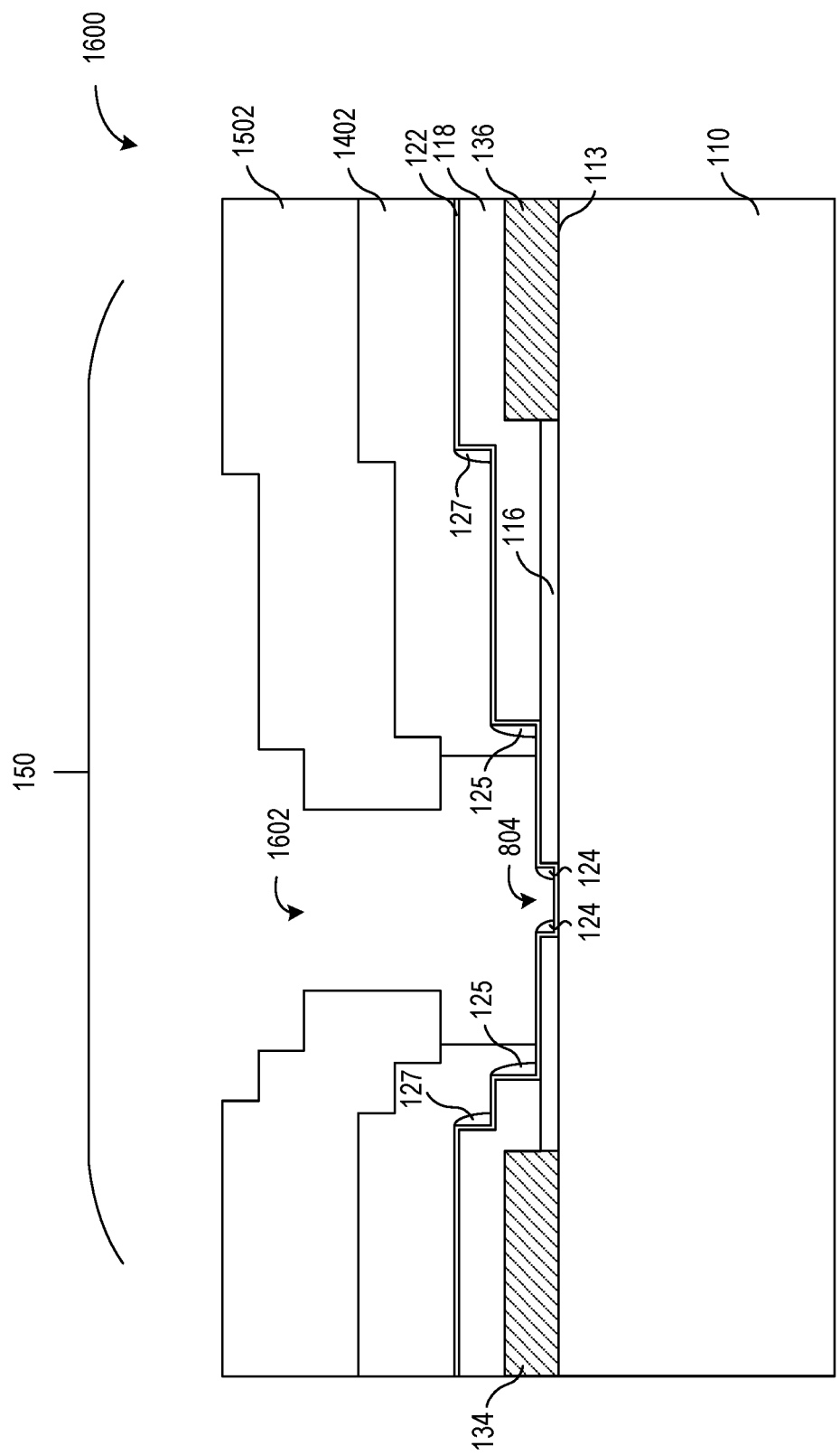

Referring next to step 222 of FIG. 2 and to FIG. 16, at a stage of fabrication 1600, openings 1602 are formed in the first photoresist layer 1402 and the second photoresist layer 1502. The openings 1602 are aligned (e.g., centered) over the gate channel 804. The openings 1602 may be formed via a photolithographic process in which portions of the first photoresist layer 1402 and the second photoresist layer 1502 are selectively exposed to UV light, then a developer solution is applied to remove portions of the first photoresist layer 1402 and the second photoresist layer 1502 to form the openings 1602. As shown, the opening in the first photoresist layer 1402 may be wider than the opening in the second photoresist layer 1502, such that the second photoresist layer 1502 overhangs the first photoresist layer 1402 in the region of the openings 1602. That is, when concurrently developing the first photoresist layer 1402 and the second photoresist layer 1502, the opening formed in the first photoresist layer 1402 undercuts the second photoresist layer 1502. In one or more embodiments, such undercutting may occur due to the first photoresist layer 1402 having a faster etch rate than the second photoresist layer 1502 with respect to the developer solution used to form the openings 1602.

Figure 17:
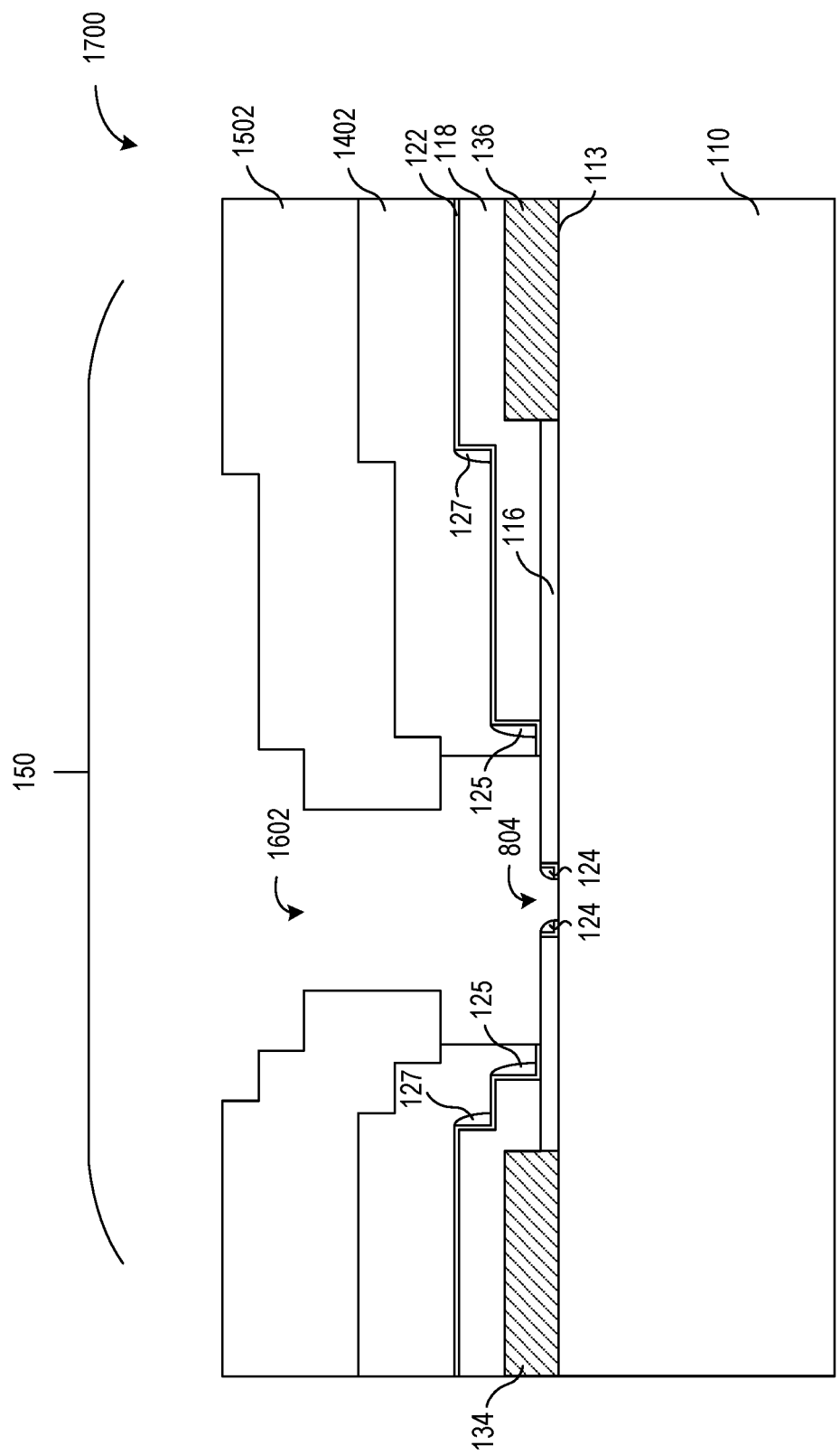

Referring next to step 224 of FIG. 2 and to FIG. 17, at a stage of fabrication 1700, portions of the third dielectric layer 122 that are exposed through the openings 1602 in the first photoresist layer 1402 and the second photoresist layer 1502 are selectively etched to expose surfaces of the first dielectric layer 116 and the surface 113 of the substrate 110 in the region of the gate channel 804. For example, a wet chemical etch process may be used to selectively etch the exposed portions of the third dielectric layer 122. Removal of these portions of the third dielectric layer 122 exposes the surface 113 of the substrate 110, such that the subsequently-formed gate structure 128 directly contacts the exposed surface 113 of the substrate 110. Removal of these portions of the third dielectric layer 122 creates a "step" defined by the upper surface of the first dielectric layer 116, a side wall of the third dielectric layer 122, and the upper surface of the dielectric layer 122, which causes a corresponding step to be present in the subsequently-formed field plate 135, as described below.

Figure 18:
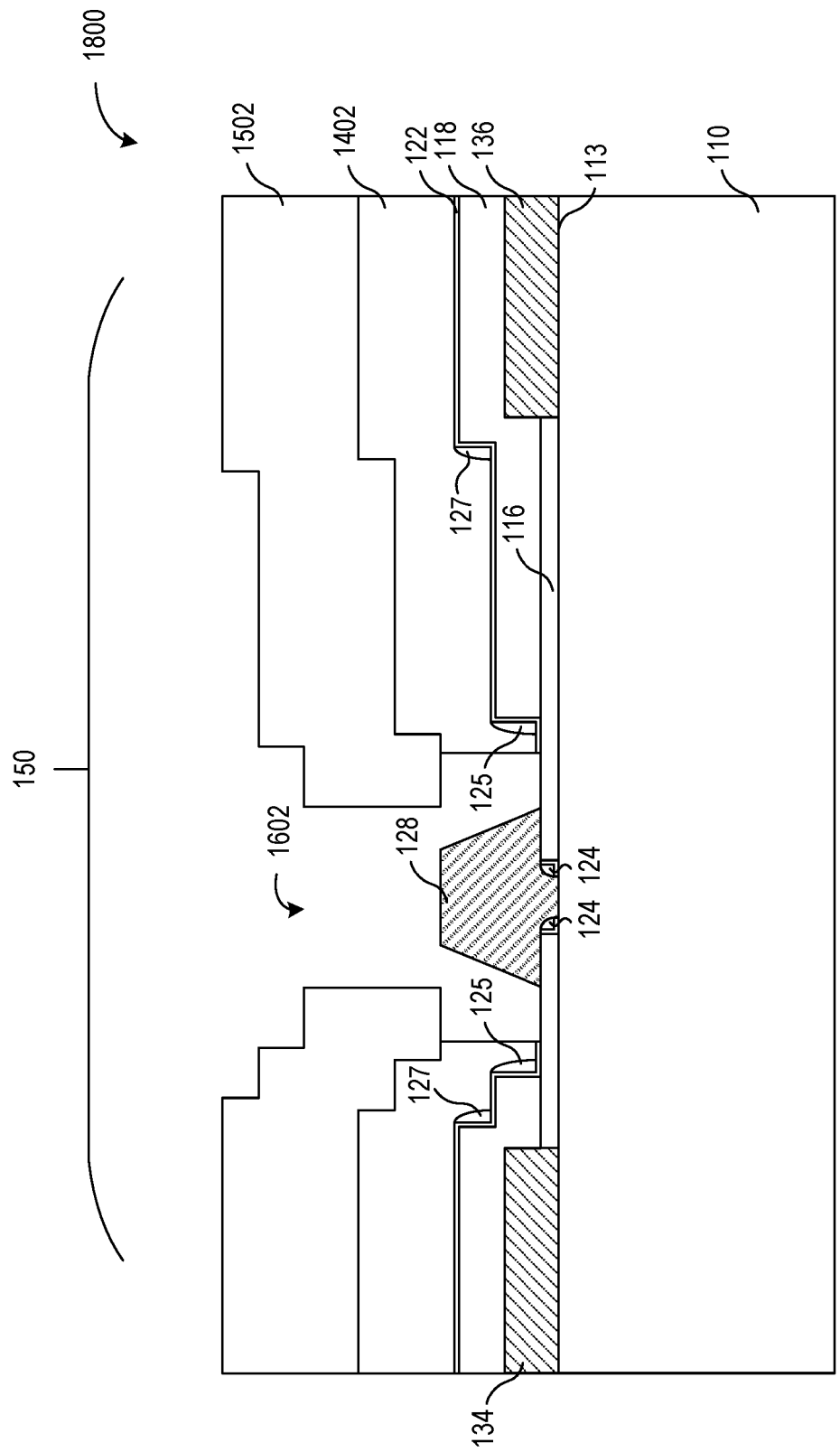

Referring next to step 226 of FIG. 2 and to FIG. 18, at a stage of fabrication 1800, a gate structure 128 is formed through the openings in the first photoresist layer and the second photoresist layer. The gate structure 128 may be electromagnetically coupled to the channel 108 through the upper surface 113 of the substrate 110 and the barrier layer 112. During operation of the transistor device 100, changes to the electric potential on gate structure 128 may shift the quasi-Fermi level for the barrier layer 112 compared to the quasi-Fermi level for the channel layer 106 and thereby modulate the electron concentration in the channel 108 within the portion of the substrate 110 under the gate structure 128.

In an embodiment, the gate structure 128 may be configured as a Schottky gate and may be formed over and directly in contact with the upper substrate surface 113 using a Schottky material layer and a conductive metal layer. In one or more embodiments, Schottky or other suitable materials may be combined with highly conductive materials in a metal stack to form the gate structure 128. For example, a Schottky material layer may first be formed in contact with the substrate 110, and a conductive low-stress metal may be deposited over the Schottky material layer to form the gate structure 128. In one or more other embodiments, the gate structure 128 may be formed over a gate dielectric or gate oxide (not illustrated) on the upper surface 113 of the substrate 110, thus forming a metal-insulator-semiconductor (MIS) junction or metal oxide semiconductor (MOS) junction, which may be electrically coupled to the channel 108 through the gate dielectric or gate oxide layer.

The gate structure 128 may have a T-shaped cross section, as shown in the present example, with a vertical stem over the substrate 110 that passes through at least the first dielectric layer 116 in the region of the gate channel 804, and a wider portion over the vertical stem that has horizontal portions that overlie and contact the upper surface of the first dielectric layer 116, the third dielectric layer 122, and the spacer structures 124, in accordance with one or more embodiments. In one or more other embodiments (not shown), the gate structure 128 may have a square or rounded cross-sectional shape. In one or more other embodiments, the vertical stem or lower portion of the gate structure 128 may be recessed through the upper surface 113 of the semiconductor substrate 110 and may extend partially into the barrier layer 112, increasing the electrical coupling of gate structure 128 to channel 108 through the barrier layer 112.

The gate metal of the gate structure 128 may be deposited by evaporation, sputtering, chemical vapor deposition, or another suitable process. For example, a first portion of the deposited gate metal may be disposed in the openings 1602 to form at least a portion of the gate structure 128 and a second portion of the deposited gate metal may be disposed on the upper surface(s) of the second photoresist layer 1502.

Figure 19:
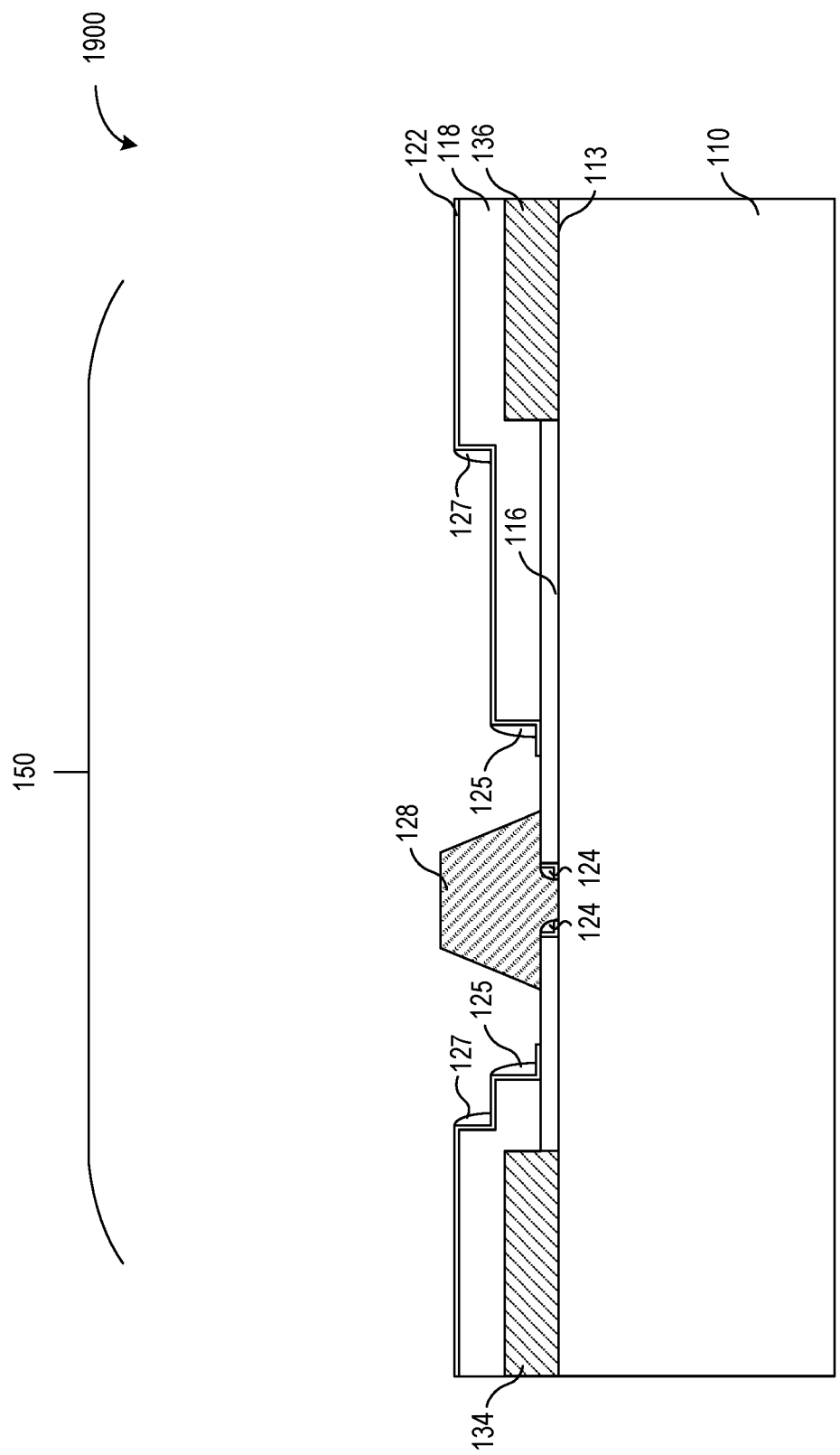

Referring next to step 228 of FIG. 2 and to FIG. 19, at a stage of fabrication 1900, the first photoresist layer 1402, the second photoresist layer 1502, and the second portion of gate metal deposited on the surface(s) of the second photoresist layer 1502 are concurrently removed via a lift-off process. For example, in the lift-off process, a photoresist striper (e.g., a solvent such as acetone, 1-methyl-2-pyrrolidone, or dimethyl sulfoxide) may be applied to remove the first photoresist layer 1402 and the second photoresist layer 1502, which detaches (i.e., "lifts-off") the excess gate metal on the surface of the second photoresist layer 1502.

While a bi-layer lift-off process has been described in connection with steps 220, 222, 224, 226, 228 of FIG. 2 and stages of fabrication 1600, 1700, 1800, 1900 of FIGS. 16-19, it should be understood that this is intended to be illustrative and not limiting. For example, other photolithographic processes (e.g., using a single photoresist layer that is developed with an undercut profile) may instead be used when forming the gate structure 128 in one or more other embodiments.

Figure 20:
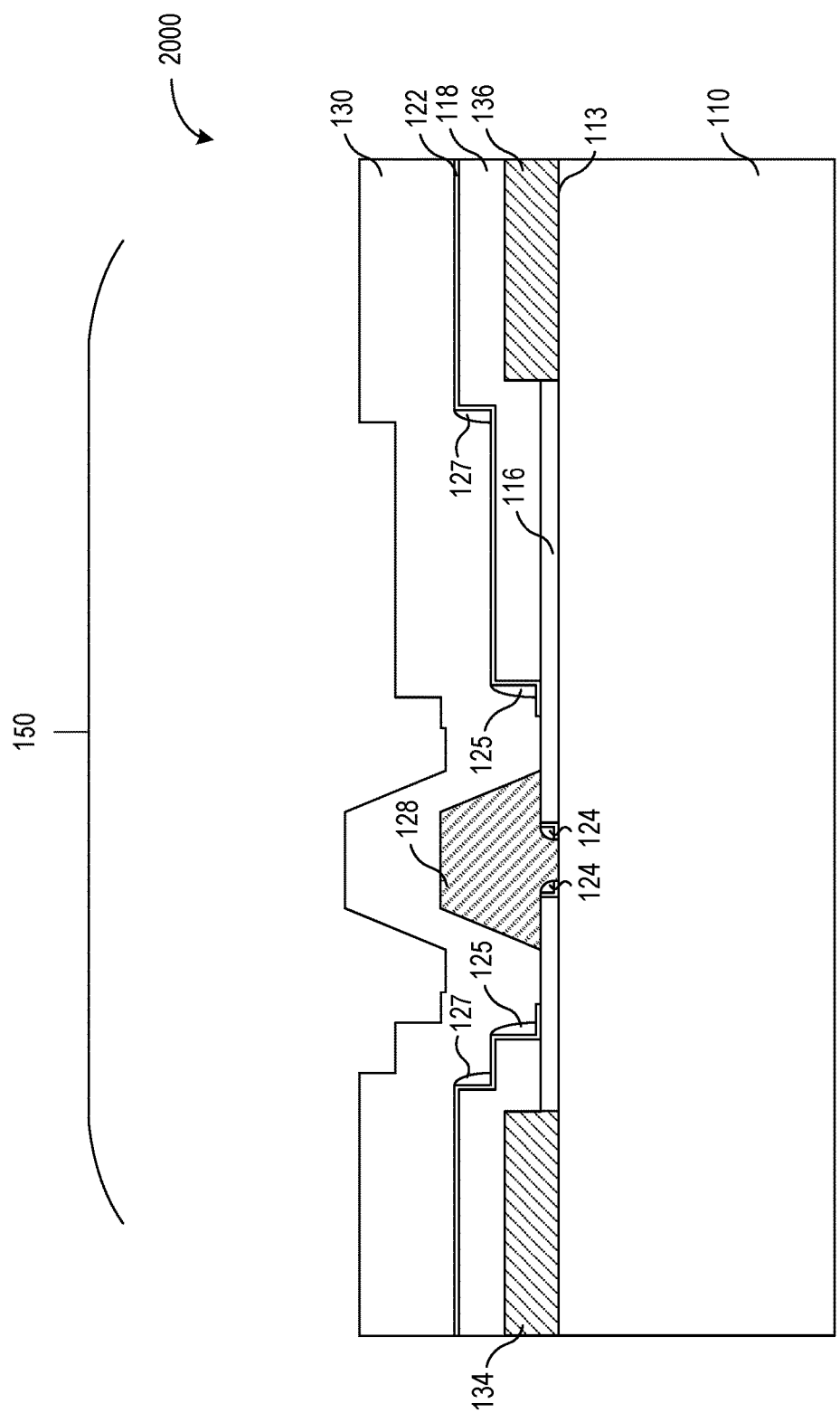

Referring next to step 230 of FIG. 2 and to FIG. 20, at a stage of fabrication 2000, an ILD layer 130 is formed over the substrate 110 (e.g., in contact with surfaces of each of the third dielectric layer 122, the first dielectric layer 116, the spacer structures 125, 127, and the gate structure 128). In one or more embodiments, the ILD layer 130 has a thickness in a range of about 500 angstroms to about 10,000 angstroms, although other suitable thicknesses may be used.

The ILD layer 130 may be formed from silicon nitride, silicon oxide, silicon oxynitride or other suitable dielectric materials.

Figure 21:
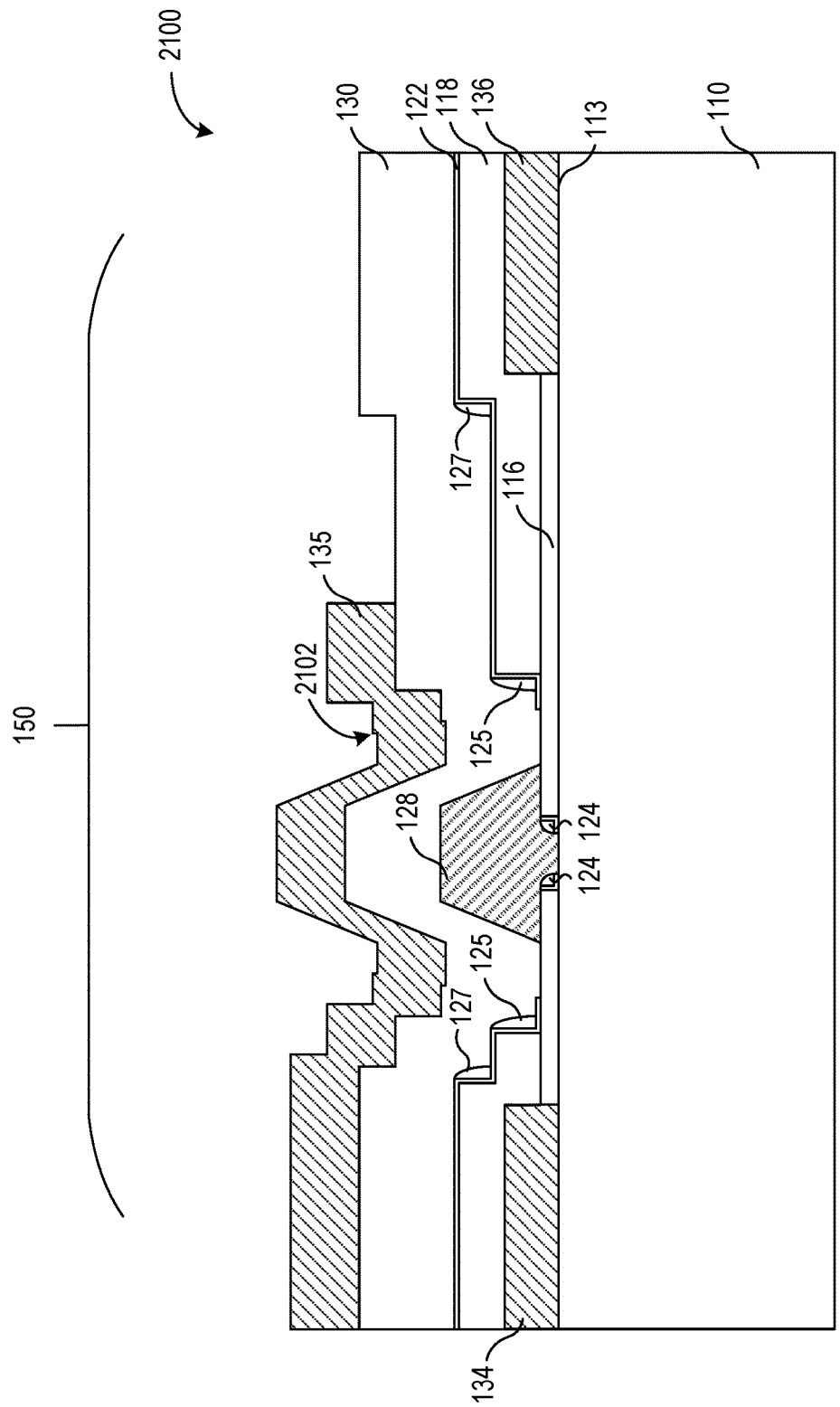

Referring next to step 232 of FIG. 2 and to FIG. 21, at a stage of fabrication 2100, a field plate 135 is formed on the ILD layer 130. For example, a conductive layer may be deposited (e.g., via sputtering, evaporation, or chemical vapor deposition as non-limiting examples) over the substrate 110 to form the field plate 135. For example, the conductive layer may include conductive material, such as TiW, TiWN, WSi, or other suitable materials. The conductive layer may have a thickness in a range of about 100 angstroms to about 5,000 angstroms, although other suitable thicknesses may be used. As shown, the field plate 135 may include a stepped portion 2102 caused by the previous removal of portions of the second dielectric layer of 118 and third dielectric layer 122 (e.g., at the stage of fabrication 1700 of FIG. 17). Because the field plate 135 includes the stepped portion 2102, linearity performance of the transistor device 100 may be advantageously improved due to corresponding modification of the gate-drain capacitance (Cgd) vs. drain-source voltage (Vds) curve attributable to the different depletion depths from the field plate 135 to the channel electrons in the channel 108. In one or more embodiments, the interconnect layers 137, 141 may be formed concurrently with the field plate 135.

It should be understood that additional processing steps may be performed to complete the transistor device 100, following performance of the method 200 of FIG. 2 (i.e., following formation of the field plate 135 at the step 232 and the stage of fabrication 2100 of FIG. 21) including the deposition and patterning of additional dielectric layers (e.g., dielectric layer 138 or other applicable dielectric layers) and metal layers (e.g., the interconnect layers 137, 140, 141, or other applicable metal layers).

Figure 22:
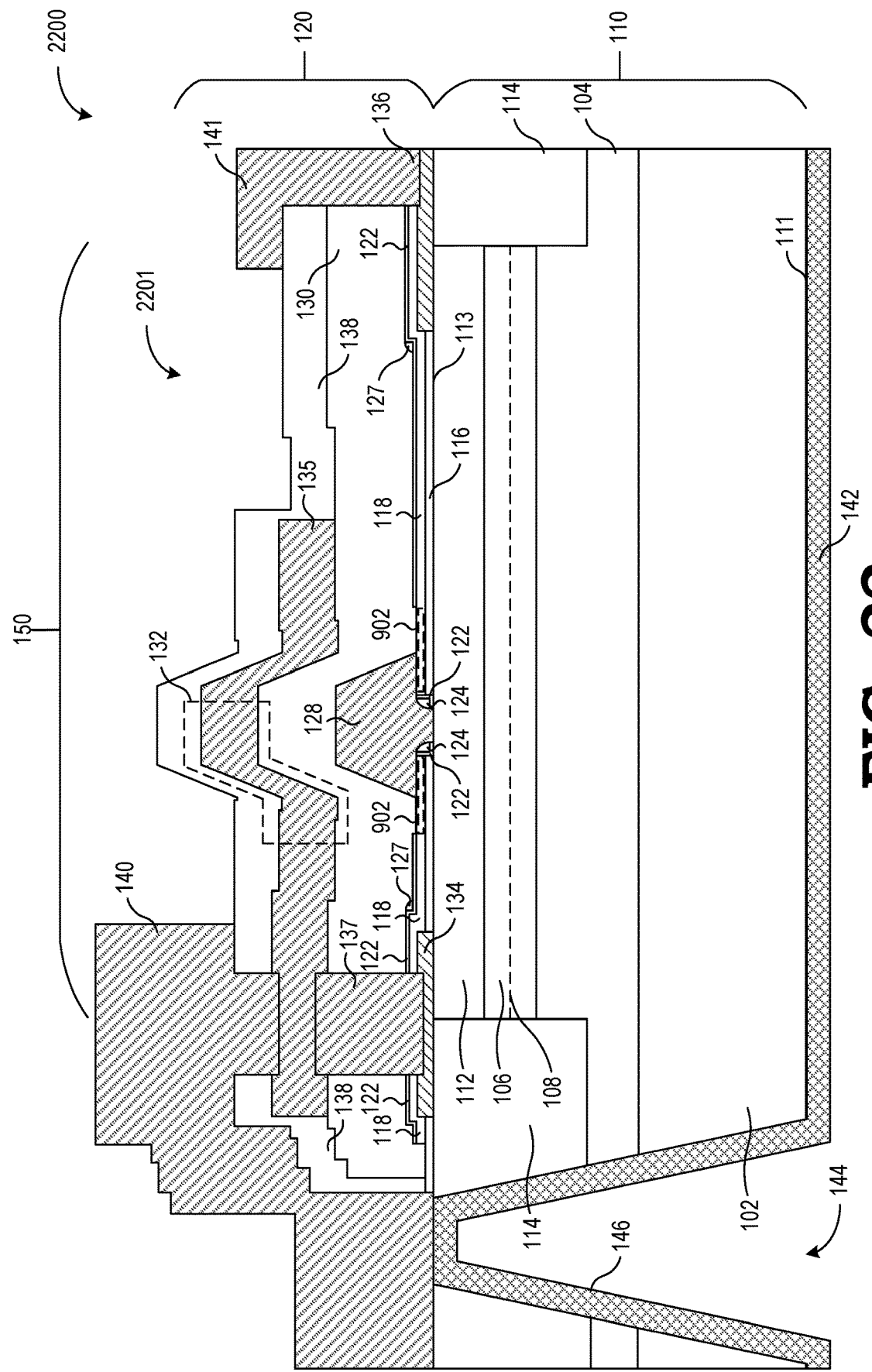
FIG. 22 is a cross-sectional side view of a transistor device, in accordance with various embodiments.

It should be understood that the examples of FIGS. 1-21 are intended to be illustrative and not limiting. That is, one or more of the steps of the method 200 of FIG. 2 and corresponding stages of fabrication of FIGS. 3-21 may be omitted when fabricating a transistor device. For example, FIG. 22 shows a cross-sectional side-view of a transistor device 2200 having a transistor 2201 that may be fabricated via the method 200 of FIG. 2 with omission of the step 212, such that the portions 902 of the second dielectric layer 118 are not removed. It should be noted that various features of the transistor device 2200 correspond to those described above in connection with the transistor device 100 of FIG. 1, with like reference numerals being used here to denote similar elements, and descriptions of such elements are not necessarily repeated here for sake of brevity.

As shown in the present example, the first dielectric layer 116 and the second dielectric layer 118 may be thinner than the corresponding layers of the transistor device 100 of FIG. 1, such that the gate structure 128 is not significantly further from the surface 113 of the substrate 110, despite the portions 902 of the second dielectric layer 118 being present between the gate structure 128 and the surface 113. For example, the first dielectric layer 116 of the transistor device 2200 may have a thickness of 150 to 750 angstroms (e.g., compared to a thickness of 300 to 1,500 angstroms in the corresponding layer of the transistor device 100 of FIG. 1), and the second dielectric layer 118 of the transistor device 2200 may have a thickness of 150 to 750 angstroms (e.g., compared to a thickness of 100 to 4,000 angstroms in the corresponding layer of the transistor device 100 of FIG. 1).

As another example, a transistor device may be fabricated using the method 200 of FIG. 2 with the steps 214, 216, 218, and 224 being omitted such that the transistor device does not include the third dielectric layer 122 or the spacer structures 124, 125, 127. In one or more such embodiments, despite the omission of the steps 214, 216, 218, and 224 of the method 200 of FIG. 2, the resulting transistor device may still achieve defect mitigation associated with surfaces of the ohmic contact structures 134, 136 being covered by the second dielectric layer 118 to prevent defect migration onto the exposed surface 113 in the gate channel 804, as well as the benefits of improving the linearity performance of the transistor device 2200, which may be attributed to the stepped structure of the field plate 135.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter. Furthermore, the term "amplifier" used herein should be understood to refer to a "power amplifier" unless noted otherwise.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a transistor device, the method comprising:
    providing a semiconductor substrate;
    forming a first dielectric layer on the semiconductor substrate;
    forming ohmic contact structures on the semiconductor substrate;
    forming a second dielectric layer on the first dielectric layer and the ohmic contact structures, the second dielectric layer directly on the ohmic contact structures;
    forming a gate channel by etching a first opening in the first dielectric layer and a second opening in the second dielectric layer, wherein a surface of the semiconductor substrate is exposed through the first opening;
    forming a third dielectric layer on the second dielectric layer and in the gate channel;
    forming at least one photoresist layer over the semiconductor substrate;
    forming at least one opening in the at least one photoresist layer by selectively removing portions of the at least one photoresist layer to expose portions of the third dielectric layer that are disposed in the gate channel;
    selectively etching the exposed portions of the third dielectric layer to expose at least the surface of the semiconductor substrate; and forming a gate structure in at least the gate channel and in contact with the surface of the semiconductor substrate.

2. The method of claim 1, further comprising:
forming an interlayer dielectric layer over the gate structure and the third dielectric layer; and
forming a field plate over the interlayer dielectric layer, wherein at least a portion of the field plate overlaps the gate structure.

3. The method of claim 2, wherein the ohmic contact structures include a first ohmic contact structure and a second ohmic contact structure, the gate structure is disposed between the first ohmic contact structure and the second ohmic contact structure, the second dielectric layer is formed covering surfaces of each of the first ohmic contact structure and the second ohmic contact structure, and the field plate is electrically coupled to the first ohmic contact structure.

4. The method of claim 1, wherein the at least one photoresist layer comprises a first photoresist layer and a second photoresist layer, and wherein forming the at least one opening comprises:
forming a third opening in the first photoresist layer; and
forming a fourth opening in the second photoresist layer, wherein the fourth opening is larger than the third opening such that a portion of the first photoresist layer overhangs the second photoresist layer at the third opening and the fourth opening.

5. The method of claim 4, wherein forming the gate structure comprises:
depositing metal over the semiconductor substrate, a first portion of the metal being deposited through the third opening and the fourth opening to form the gate structure, and a second portion of the metal being deposited on surfaces of the first photoresist layer.

6. The method of claim 5, further comprising:
removing the second portion of the metal via concurrent removal of the first photoresist layer and the second photoresist layer.

7. The method of claim 1, further comprising:
depositing a dielectric spacer layer on the third dielectric layer; and
etching the dielectric spacer layer to form at least one spacer structure including a first spacer structure disposed in the gate channel.

8. The method of claim 7, wherein the at least one spacer structure further includes a second spacer structure disposed in the gate channel, a third spacer structure disposed over at least the first dielectric layer and the second dielectric layer, and a fourth spacer structure disposed over at least the first dielectric layer and the second dielectric layer.

9. The method of claim 1, wherein forming the gate channel further comprises:
forming a photoresist layer over the second dielectric layer;
forming a third opening in the photoresist layer; and
etching additional portions of the second dielectric layer, undercutting the photoresist layer.

10. The method of claim 9, wherein forming the third dielectric layer comprises:
forming the third dielectric layer on side walls of the second dielectric layer, wherein the side walls of the second dielectric layer define at least an additional portion of the gate channel.

11. The method of claim 1, wherein forming the third dielectric layer further comprises:
forming the third dielectric layer on surfaces of the second dielectric layer, side walls of the first dielectric layer, and the surface of the semiconductor substrate in the gate channel, wherein the side walls of the first dielectric layer define at least a portion of the gate channel.

* * * * *